(12) United States Patent
Yamaguchi et al.

(10) Patent No.: US 11,476,095 B2
(45) Date of Patent: *Oct. 18, 2022

(54) ELECTROSTATIC CHUCK AND PLASMA PROCESSING APPARATUS

(71) Applicant: Tokyo Electron Limited, Tokyo (JP)

(72) Inventors: Shin Yamaguchi, Kurokawa-gun (JP); Akiyoshi Mitsumori, Kurokawa-gun (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/027,101

(22) Filed: Sep. 21, 2020

(65) Prior Publication Data

US 2021/0005432 A1  Jan. 7, 2021

Related U.S. Application Data

(63) Continuation of application No. 15/987,110, filed on May 23, 2018, now Pat. No. 10,825,660.

(30) Foreign Application Priority Data

May 30, 2017 (JP) .................. 2017-106728

(51) Int. Cl.
*H01J 37/32* (2006.01)
*H02N 13/00* (2006.01)
(Continued)

(52) U.S. Cl.
CPC .... *H01J 37/32449* (2013.01); *C23C 16/4586* (2013.01); *H01J 37/3255* (2013.01);
(Continued)

(58) Field of Classification Search
CPC ........... H01J 37/32027; H01J 37/32715; H01J 37/32449; H01J 37/3255; H01J 37/32724;
(Continued)

(56) References Cited

U.S. PATENT DOCUMENTS 3,256,598 A  6/1966 Kramer et al.
5,426,558 A  6/1995 Sherman
(Continued)

FOREIGN PATENT DOCUMENTS

JP  H9-162272 A  6/1997
JP  2003-124298 A  4/2003
(Continued)

*Primary Examiner* — Laura Edwards
(74) *Attorney, Agent, or Firm* — Studebaker & Brackett PC

(57) ABSTRACT

An electrostatic chuck of an embodiment includes a base, a dielectric layer, and a chuck main body. The dielectric layer is provided on the base, and is fixed to the base. The chuck main body is mounted on the dielectric layer. The chuck main body has a ceramic main body, a first electrode, a second electrode, and a third electrode. The ceramic main body has a substrate mounting region. The first electrode is provided in the substrate mounting region. The second electrode and the third electrode form a bipolar electrode. The second electrode and the third electrode are provided in the ceramic main body, and are provided between the first electrode and the dielectric layer.

6 Claims, 14 Drawing Sheets

(51) Int. Cl.
*C23C 16/458* (2006.01)
*H01L 21/683* (2006.01)
*H01L 21/687* (2006.01)
*H01L 21/67* (2006.01)

(52) U.S. Cl.
CPC .. *H01J 37/32724* (2013.01); *H01L 21/67109* (2013.01); *H01L 21/6831* (2013.01); *H01L 21/6833* (2013.01); *H01L 21/68757* (2013.01); *H01L 21/68785* (2013.01); *H02N 13/00* (2013.01); *Y10T 279/23* (2015.01)

(58) Field of Classification Search
CPC .......... H01L 21/6831; H01L 21/68785; H01L 21/67109; H01L 21/68757; H01L 21/6833; H02N 13/00; C23C 16/4586; Y10T 279/23
USPC ............................................. 118/723 E, 724
See application file for complete search history.

(56) References Cited

U.S. PATENT DOCUMENTS

| | | | |
|---|---|---|---|
| 5,600,610 A | | 2/1997 | Hill et al. |
| 10,825,660 B2 * | | 11/2020 | Yamaguchi ....... H01J 37/32724 |
| 2004/0233609 A1 * | | 11/2004 | Yoshida ................. H02N 13/00 361/234 |
| 2006/0291132 A1 | | 12/2006 | Kanno et al. |
| 2009/0178764 A1 * | | 7/2009 | Kanno ............. H01L 21/67103 156/345.52 |
| 2009/0183835 A1 | | 7/2009 | Furuse et al. |
| 2011/0297082 A1 * | | 12/2011 | Watanabe ................ C23C 28/00 118/663 |
| 2012/0281334 A1 | | 11/2012 | Sasaki et al. |
| 2013/0088809 A1 | | 4/2013 | Parkhe et al. |
| 2016/0035610 A1 | | 2/2016 | Park et al. |
| 2016/0196999 A1 | | 7/2016 | Yanoh et al. |

FOREIGN PATENT DOCUMENTS

| | | |
|---|---|---|
| JP | 2005-064460 A | 3/2005 |
| JP | 2006-140455 A | 6/2006 |
| JP | 2015-162618 A | 9/2015 |
| JP | 2016-122740 A | 7/2016 |
| JP | 2016-136552 A | 7/2016 |
| WO | 2016/035878 A1 | 3/2016 |

* cited by examiner

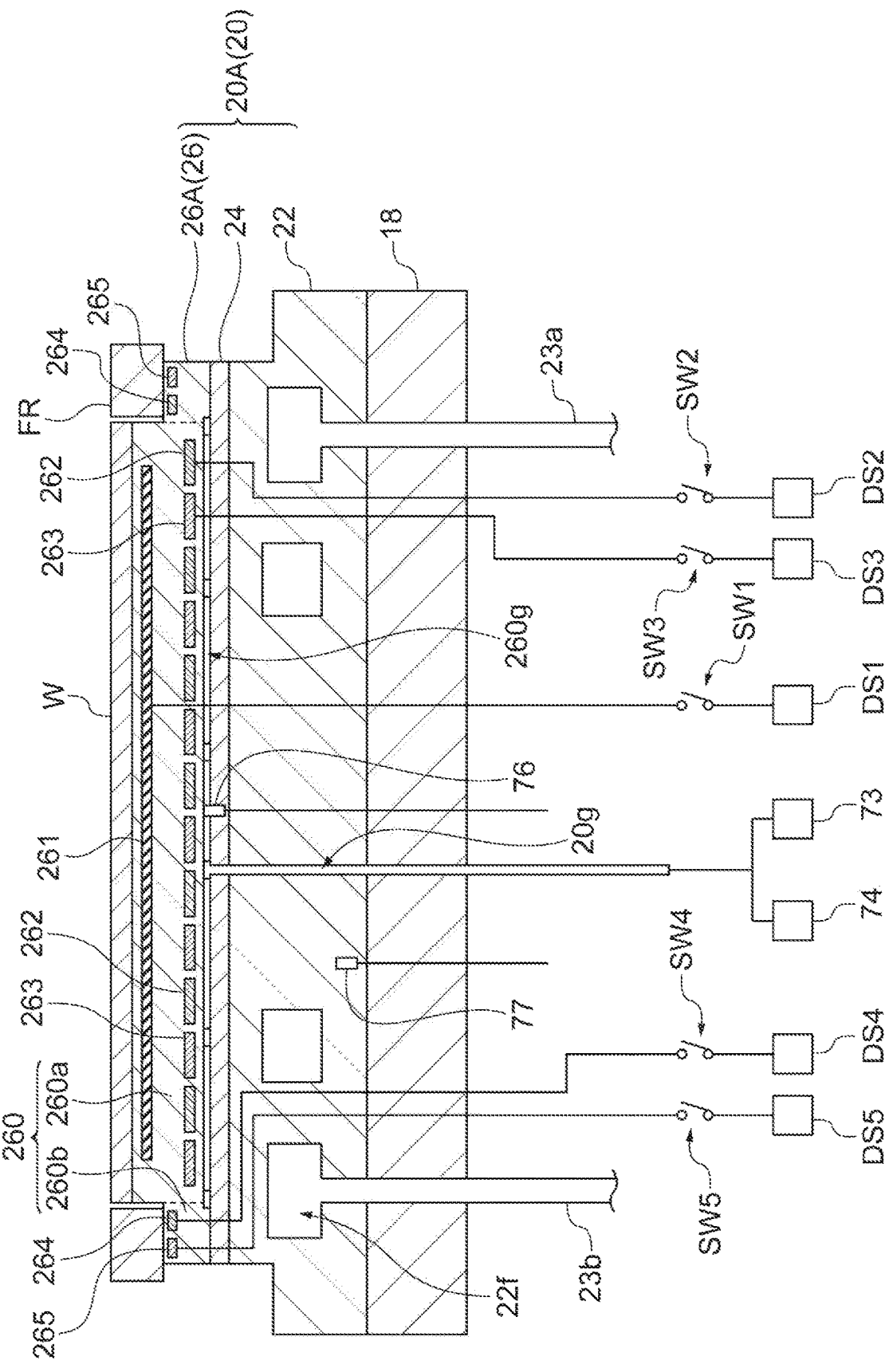

ELECTROSTATIC CHUCK AND PLASMA PROCESSING APPARATUS

CROSS-REFERENCE TO RELATED APPLICATIONS

This application is a Continuation of U.S. patent application Ser. No. 15/987,110 filed May 23, 2018, now U.S. Pat. No. 10,825,660, which is based on and claims the benefit of priority from Japanese Patent Application No. 2017-106728 filed on May 30, 2017, the entire contents of which are incorporated herein by reference.

FIELD

Exemplary embodiment of the present disclosure relate to an electrostatic chuck and a plasma processing apparatus.

BACKGROUND

In manufacturing of electronic devices, a plasma processing apparatus is used to perform processing on a substrate. The plasma processing apparatus generally includes a chamber body that provides a chamber and an electrostatic chuck provided in the chamber.

The electrostatic chuck has a function of holding a substrate, and a function of adjusting the temperature of the substrate. The electrostatic chuck has a base and a chuck main body. A flow channel for a heat exchange medium (for example, a refrigerant) is formed in the base. The chuck main body has a ceramic main body and a film-shaped electrode provided in the ceramic main body. A DC power supply is electrically connected to the electrode of the chuck main body. A substrate is placed on the chuck main body. In a case where a voltage from the DC power supply is applied to the electrode of the chuck main body, an electrostatic attractive force is generated between the chuck main body and the substrate. Due to the generated electrostatic attractive force, the substrate is attracted to the chuck main body and held on the chuck main body. In addition, by supplying the heat exchange medium to the base, heat exchange is performed between the base and the chuck main body, the temperature of the chuck main body is adjusted, and the temperature of the substrate is adjusted. The chuck main body is bonded onto the base with an adhesive. The plasma processing apparatus having such a stage is disclosed, for example, in Japanese Patent Application Laid-Open Publication No. 2015-162618.

SUMMARY

According to an aspect, there is provided an electrostatic chuck. The electrostatic chuck according to the aspect includes a base, a dielectric layer, and a chuck main body. A flow channel for a heat exchange medium is provided in the base. The dielectric layer is provided on the base, and is fixed to the base. The chuck main body is mounted on the dielectric layer. The chuck main body is configured to hold a substrate placed thereon with an electrostatic attractive force. The chuck main body has a ceramic main body, a first electrode, a second electrode, and a third electrode. The ceramic main body has a substrate mounting region. The first electrode is provided in the substrate mounting region in order to generate an electrostatic attractive force between a substrate mounted on the substrate mounting region and the chuck main body. The second electrode and the third electrode form a bipolar electrode. The second electrode and the third electrode are provided in the ceramic main body and are provided between the first electrode and the dielectric layer in order to generate an electrostatic attractive force between the chuck main body and the dielectric layer.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 2 is a cross-sectional view of an electrostatic chuck according to a first exemplary embodiment.

DETAILED DESCRIPTION

Figure 1:
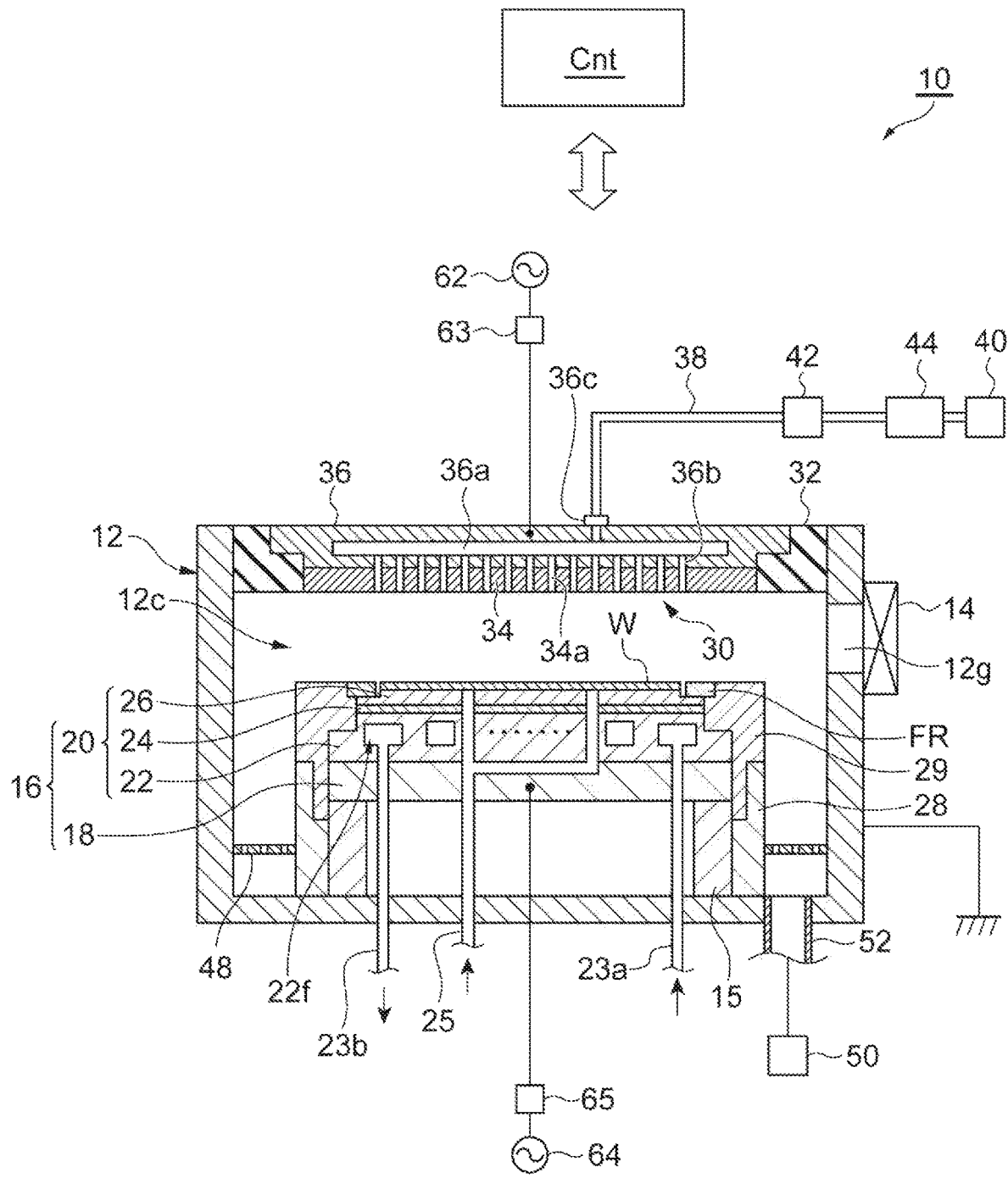
FIG. 1 schematically illustrates a plasma processing apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In the plasma processing performed in the plasma processing apparatus, the temperature of the substrate placed on the chuck main body may be set to a low temperature. In order to set the temperature of the substrate to a low temperature, a refrigerant is supplied to the base as a heat exchange medium.

In a case where the temperature of the base is set to a temperature equal to or less than the glass transition point of the adhesive, the adhesive hardens to lose flexibility. In a case where the flexibility of the adhesive is lost, the chuck main body may be peeled off from the base or cracking may occur in the chuck main body due to the difference between the linear expansion coefficient of the base and the linear expansion coefficient of the chuck main body. That is, the electrostatic chuck may be damaged. Even if the difference between the linear expansion coefficient of the base and the linear expansion coefficient of the chuck main body is small, in a case where the difference between the temperature of the electrostatic chuck at the time of use thereof and the temperature in a case where the chuck main body is bonded to the base is large, warpage may occur in the electrostatic chuck and the electrostatic chuck may not be able to hold the substrate. That is, malfunction of the electrostatic chuck may occur. Therefore, it is required to enable the chuck main body to be fixed to the base without using an adhesive.

According to an aspect, there is provided an electrostatic chuck. The electrostatic chuck according to the aspect includes a base, a dielectric layer, and a chuck main body. A flow channel for a heat exchange medium is provided in the base. The dielectric layer is provided on the base, and is fixed to the base. The chuck main body is mounted on the dielectric layer. The chuck main body is configured to hold a substrate placed thereon with an electrostatic attractive force. The chuck main body has a ceramic main body, a first electrode, a second electrode, and a third electrode. The ceramic main body has a substrate mounting region. The first electrode is provided in the substrate mounting region in order to generate an electrostatic attractive force between a substrate mounted on the substrate mounting region and the chuck main body. The second electrode and the third electrode form a bipolar electrode. The second electrode and the third electrode are provided in the ceramic main body and are provided between the first electrode and the dielectric layer in order to generate an electrostatic attractive force between the chuck main body and the dielectric layer.

In the electrostatic chuck according to the aspect, by applying a voltage to the first electrode during plasma generation, an electrostatic attractive force is generated between the chuck main body and the substrate that receives electric charges from the plasma. Due to the generated electrostatic attractive force, the substrate is held on the chuck main body. In addition, an electrostatic attractive force is generated between the chuck main body and the dielectric layer even without a plasma by applying voltages with opposite polarities to the second electrode and the third electrode. Due to the generated electrostatic attractive force, the chuck main body is attracted to the dielectric layer, fixed to the dielectric layer, and fixed to the base via the dielectric layer. Therefore, according to the electrostatic chuck, it is possible to fix the chuck main body to the base at an arbitrary timing without using an adhesive. In a case where a temperature difference occurs between the base and the chuck main body, the chuck main body can be fixed to the base via the dielectric layer by the electrostatic attractive force, after the temperature difference between the temperature of the base and the temperature of the chuck main body is reduced. Therefore, it is possible to suppress the peeling of the chuck main body and the cracking of the chuck main body. In addition, it is possible to suppress the warpage of the electrostatic chuck.

In an embodiment, the ceramic main body may further provide an outer peripheral region which surrounds the substrate mounting region, and on which a focus ring is placed.

In an embodiment, the chuck main body may further include a fourth electrode and a fifth electrode that form a bipolar electrode. The fourth electrode and the fifth electrode may be provided in the outer peripheral region to generate an electrostatic attractive force between the focus ring and the chuck main body. In the embodiment, an electrostatic attractive force is generated between the outer peripheral region and the focus ring even without a plasma by applying voltages with opposite polarities to the fourth electrode and the fifth electrode. Due to the generated electrostatic attractive force, the focus ring is held in the outer peripheral region of the chuck main body.

In an embodiment, the fourth electrode and the fifth electrode may be farther from the dielectric layer than the second electrode and the third electrode. In another embodiment, the second electrode, the third electrode, the fourth electrode, and the fifth electrode may be provided along the same plane.

In an embodiment, the second electrode and the third electrode may be provided across the substrate mounting region and the outer peripheral region. In the embodiment, an electrostatic attractive force is generated between the outer peripheral region and the focus ring by applying voltages with opposite polarities to the second electrode and the third electrode. Due to the generated electrostatic attractive force, the focus ring is held in the outer peripheral region of the chuck main body.

In an embodiment, a first flow channel that is opened on a surface of the outer peripheral region on a side opposite to a side of the dielectric layer may be formed in the base, the dielectric layer, and the chuck main body. In the embodiment, even if the focus ring is attracted to the outer peripheral region of the chuck main body due to residual charges or the like, the focus ring can be detached from the outer peripheral region of the chuck main body by supplying gas to the first flow channel.

In an embodiment, the dielectric layer may be a ceramic sprayed film. In another embodiment, the dielectric layer may be a resin layer bonded directly to the base or bonded to the base with an adhesive layer interposed therebetween.

In an embodiment, a groove may be provided on a surface of the chuck main body on a side of the dielectric layer or a surface of the dielectric layer on a side of the chuck main body, and a second flow channel connected to the groove may be formed in the base and the dielectric layer. In the embodiment, even if the chuck main body is attracted to the dielectric layer due to residual charges or the like, the chuck main body can be detached from the dielectric layer by supplying gas to the second flow channel.

In an embodiment, the electrostatic chuck may further include a first temperature sensor configured to measure a temperature of the base and a second temperature sensor configured to measure a temperature of the chuck main body.

According to another aspect, there is provided a plasma processing apparatus. The plasma processing apparatus includes a chamber main body, the electrostatic chuck according to any one of the above aspect and the various embodiments, a radio frequency power supply, and first to third DC power supplies. The chamber main body provides a chamber. The radio frequency power supply is electrically connected to the base of the electrostatic chuck. The first DC power supply is electrically connected to the first electrode. The second DC power supply is electrically connected to the second electrode. The third DC power supply is electrically connected to the third electrode.

In an embodiment, the plasma processing apparatus may further include a fourth DC power supply electrically connected to the fourth electrode of the electrostatic chuck and a fifth DC power supply electrically connected to the fifth electrode of the electrostatic chuck.

In an embodiment, the plasma processing apparatus may further include a first gas supply unit and a first exhaust device that are selectively connected to the first flow channel of the electrostatic chuck.

In an embodiment, the plasma processing apparatus may further include a second gas supply unit and a second exhaust device that are selectively connected to the second flow channel of the electrostatic chuck.

Hereinafter, various embodiments will be described in detail with reference to the drawings. In the drawing, the same or equivalent portions are denoted by the same reference symbols.

FIG. 1 schematically illustrates a plasma processing apparatus according to an exemplary embodiment. FIG. 1 schematically illustrates a structure in a longitudinal section of a plasma processing apparatus 10 according to the exemplary embodiment. The plasma processing apparatus 10 shown in FIG. 1 is a capacitively coupled plasma processing apparatus.

The plasma processing apparatus 10 includes a chamber body 12. The chamber body 12 has an approximately cylindrical shape. The chamber body 12 provides its internal space as a chamber 12c. The chamber body 12 is formed of, for example, aluminum. The chamber body 12 is connected to the ground potential. A film having plasma resistance is formed on the inner wall surface of the chamber body 12, that is, a wall surface defining a chamber 12c. The film may be a film formed by an anodic oxidation treatment or a ceramic film, such as a film formed of yttrium oxide. A passage 12g is formed in a side wall of the chamber body 12. In a case where a substrate W is transferred into the chamber 12c and a case where the substrate W is transferred out from the chamber 12c, the substrate W passes through the passage 12g. A gate valve 14 is attached to the side wall of the chamber body 12. The passage 12g can be opened and closed by the gate valve 14.

In the chamber 12c, a support portion 15 extends upward from the bottom portion of the chamber body 12. The support portion 15 has an approximately cylindrical shape, and is formed of an insulating material, such as quartz. A stage 16 is mounted on the support portion 15, and the stage 16 is supported by the support portion 15. The stage 16 is configured to support the substrate W in the chamber 12c. The stage 16 includes an electrode plate 18 and an electrostatic chuck 20. The electrode plate 18 has conductivity, and has an approximately disc shape. The electrode plate 18 is formed of, for example, aluminum. The electrostatic chuck 20 is provided on the electrode plate 18. The electrostatic chuck 20 includes a base 22, a dielectric layer 24, and a chuck main body 26. The base 22 has conductivity, and forms a lower electrode. The base 22 is provided on the electrode plate 18, and is electrically connected to the electrode plate 18.

In the base 22, a flow channel 22f is provided. The flow channel 22f is a flow channel for a heat exchange medium. As the heat exchange medium, a liquid refrigerant or a refrigerant (for example, Freon) for cooling the base 22 by its vaporization is used. The heat exchange medium is supplied to the flow channel 22f from a chiller unit provided outside the chamber body 12 through a pipe 23a. The heat exchange medium supplied to the flow channel 22f is returned to the chiller unit through a pipe 23b. In this manner, the heat exchange medium is supplied to the flow channel 22f to circulate between the flow channel 22f and the chiller unit.

A gas supply line 25 is provided in the plasma processing apparatus 10. The gas supply line 25 supplies a heat transfer gas from a gas supply mechanism, for example, helium gas, between the upper surface of the chuck main body 26 and the back surface (bottom surface) of the substrate W.

A cylindrical portion 28 extends upward from the bottom portion of the chamber body 12. The cylindrical portion 28 extends along the outer periphery of the support portion 15. The cylindrical portion 28 has conductivity, and has an approximately cylindrical shape. The cylindrical portion 28 is connected to the ground potential. An insulating portion 29 is provided on the cylindrical portion 28. The insulating portion 29 has an insulation property, and is formed of ceramic, such as quartz. The insulating portion 29 has an approximately cylindrical shape, and extends along the outer periphery of the electrode plate 18 and the outer periphery of the electrostatic chuck 20. A focus ring FR is mounted on the outer peripheral region of the chuck main body 26 of the electrostatic chuck 20. The focus ring FR has an approximately annular plate shape, and is formed of, for example, silicon or silicon carbide (SiC). The focus ring FR is provided so as to surround the edge of a substrate mounting region of the chuck main body 26 and the edge of the substrate W.

The plasma processing apparatus 10 further includes an upper electrode 30. The upper electrode 30 is provided above the stage 16. The upper electrode 30 closes an upper opening of the chamber body 12 together with a member 32. The member 32 has an insulation property. The upper electrode 30 is supported by the upper portion of the chamber body 12 by the member 32.

The upper electrode 30 includes a top plate 34 and a support body 36. The bottom surface of the top plate 34 defines the chamber 12c. A plurality of gas delivery holes 34a are provided in the top plate 34. Each of the plurality of gas delivery holes 34a penetrates the top plate 34 in the plate thickness direction (vertical direction). The top plate 34 is formed of, for example, silicon, although the material is not limited thereto. Alternatively, the top plate 34 may have a structure in which a plasma resistant film is provided on the surface of a base material formed of aluminum. The film may be a film formed by an anodic oxidation treatment or a ceramic film, such as a film formed of yttrium oxide.

The support body 36 is a component that detachably supports the top plate 34. The support body 36 can be formed of a conductive material, for example, aluminum. A gas diffusion chamber 36a is provided inside the support body 36. A plurality of gas holes 36b extend downward from the gas diffusion chamber 36a. The plurality of gas holes 36b communicate with the plurality of gas delivery holes 34a, respectively. A gas introduction port 36c for introducing a gas to the gas diffusion chamber 36a is formed in the support body 36, and a gas supply pipe 38 is connected to the gas introduction port 36c.

A gas source group 40 is connected to the gas supply pipe 38 through a valve group 42 and a flow rate controller group 44. The gas source group 40 includes a plurality of gas sources. The valve group 42 includes a plurality of valves, and the flow rate controller group 44 includes a plurality of flow rate controllers. Each of the plurality of flow rate controllers of the flow rate controller group 44 is a mass flow controller or a pressure control type flow rate controller. Each of the plurality of gas sources of the gas source group 40 is connected to the gas supply pipe 38 through a corresponding valve of the valve group 42 and a corresponding flow rate controller of the flow rate controller group 44. The plasma processing apparatus 10 can supply a gas from one or more gas sources, which are selected from the plurality of gas sources of the gas source group 40, to the chamber 12c at the individually adjusted flow rate.

A baffle plate 48 is provided between the cylindrical portion 28 and the side wall of the chamber body 12. The baffle plate 48 can be formed, for example, by coating ceramic, such as yttrium oxide, on an aluminum base material. A number of through holes are formed in the baffle plate 48. Below the baffle plate 48, an exhaust pipe 52 is connected to the bottom portion of the chamber body 12. An exhaust device 50 is connected to the exhaust pipe 52. The exhaust device 50 includes a pressure controller, such as an automatic pressure control valve, and a vacuum pump, such as a turbo molecular pump, and can depressurize the chamber 12c.

The plasma processing apparatus 10 further includes a first radio frequency power supply 62. The first radio frequency power supply 62 is a power supply for generating a first radio frequency wave for plasma generation. The first radio frequency wave has a frequency within a range of 27 to 100 MHz, for example, 60 MHz. The first radio frequency power supply 62 is connected to the upper electrode 30 through a matching unit 63. The matching unit 63 has a circuit for matching the output impedance of the first radio frequency power supply 62 and the impedance on the load side (upper electrode 30 side). The first radio frequency power supply 62 may be connected to the electrode plate 18 through the matching unit 63. In a case where the first radio frequency power supply 62 is connected to the electrode plate 18, the upper electrode 30 is connected to the ground potential.

The plasma processing apparatus 10 further includes a second radio frequency power supply 64. The second radio frequency power supply 64 is a power supply for generating a second radio frequency wave for bias for attracting ions to the substrate W. The second radio frequency is lower than the first radio frequency. The second radio frequency wave has a frequency within a range of 400 kHz to 13.56 MHz, for example, 400 kHz. The second radio frequency power supply 64 is connected to the electrode plate 18 through a matching unit 65. The matching unit 65 has a circuit for matching the output impedance of the second radio frequency power supply 64 and the impedance on the load side (electrode plate 18 side).

In an embodiment, the plasma processing apparatus 10 may further include a controller Cnt. The controller Cnt is a computer including a processor, a storage device, an input device, a display device, and the like, and controls each unit of the plasma processing apparatus 10. Specifically, the controller Cnt executes a control program stored in the storage device, and controls each unit of the plasma processing apparatus 10 based on recipe data stored in the storage device. As a result, the plasma processing apparatus 10 executes the process designated by the recipe data.

Hereinafter, electrostatic chucks of some embodiments that can be adopted as the electrostatic chuck 20 will be described.

Electrostatic Chuck of a First Exemplary Embodiment

FIG. 2 is a cross-sectional view of an electrostatic chuck according to a first exemplary embodiment. An electrostatic chuck 20A shown in FIG. 2 can be used as the electrostatic chuck 20 of the plasma processing apparatus 10. The electrostatic chuck 20A has the base 22 and the dielectric layer 24. The electrostatic chuck 20A has a chuck main body 26A as the chuck main body 26.

The base 22 has conductivity, and has an approximately disc shape. The base 22 is formed of, for example, aluminum. The base 22 is provided on the electrode plate 18. The base 22 is electrically connected to the electrode plate 18. The base 22 forms a lower electrode, and a radio frequency wave (a second radio frequency wave or a first radio frequency wave and a second radio frequency wave) is supplied to the base 22 through the electrode plate 18. The flow channel 22f described above is formed inside the base 22. The flow channel 22f extends, for example, in a spiral shape in the base 22.

Figure 3A:
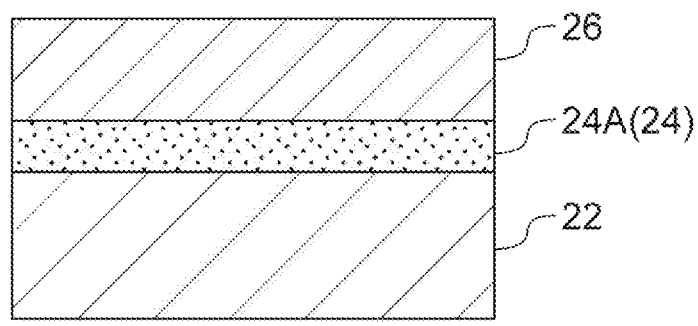
FIGS. 3A, 3B, and 3C are cross-sectional views of an exemplary dielectric layer.
Figure 3B:
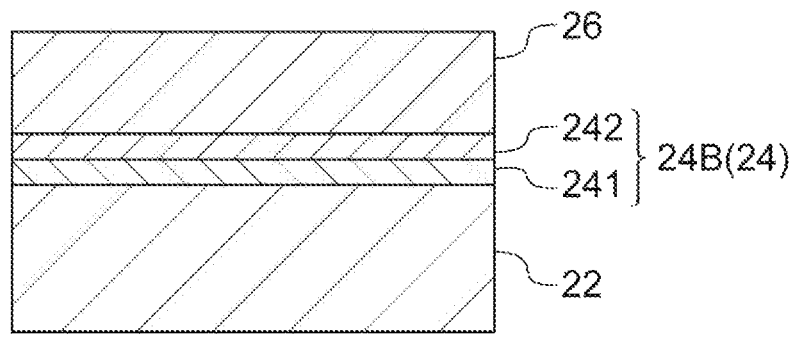
Figure 3C:
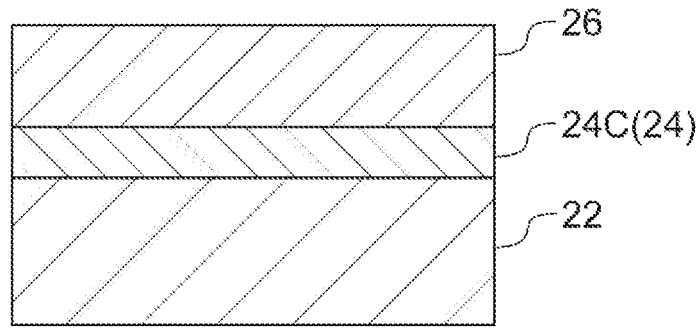

The dielectric layer 24 is provided on the base 22, and is fixed to the base 22. The dielectric layer 24 is formed of a dielectric material. FIGS. 3A, 3B, and 3C are cross-sectional views of an exemplary dielectric layer. A dielectric layer 24A shown in FIG. 3A, a dielectric layer 24B shown in FIG. 3B, and a dielectric layer 24C shown in FIG. 3C can be adopted as the dielectric layer 24.

The dielectric layer 24A is a film formed of ceramic, for example, aluminum oxide, or yttrium oxide, and is provided on the upper surface of the base 22. The dielectric layer 24A is formed, for example, by thermal spraying of ceramic onto the upper surface of the base 22. The dielectric layer 24B has an adhesive layer 241 and a resin layer 242. The resin layer 242 is fixed to the upper surface of the base 22 by the adhesive layer 241. The resin layer 242 is formed of, for example, polyimide. The dielectric layer 24C is a resin film. The dielectric layer 24C is directly bonded to the upper surface of the base 22. The dielectric layer 24C is bonded to the upper surface of the base 22 by a laser or bonded to the upper surface of the base 22 by using an anchor effect. The dielectric layer 24C is formed of, for example, fluorine-based resin.

The thickness of the dielectric layer 24, such as the dielectric layer 24A, 24B, or 24C is 50 μm or more and 500 μm or less. The dielectric layer 24 having such a thickness can follow deformation of the base 22 due to heat. In order to promote heat exchange between the base 22 and the chuck main body 26, the thickness of the dielectric layer 24 is set so as to have a thermal resistance of a predetermined value or less. The thermal resistance is defined as a value obtained by dividing the thickness of the dielectric layer 24 by the thermal conductivity of the dielectric layer 24.

Referring to FIG. 2 again, the chuck main body 26A is mounted on the dielectric layer 24. The chuck main body 26A is configured to hold a substrate W placed thereon with an electrostatic attractive force. The electrostatic attractive force is a Coulomb force or a Johnsen-Rahbek force. The chuck main body 26A includes a ceramic main body 260, a first electrode 261, a second electrode 262, a third electrode 263, a fourth electrode 264, and a fifth electrode 265.

The ceramic main body 260 has an approximately disc shape. The ceramic main body 260 has a substrate mounting region 260a and an outer peripheral region 260b. The substrate mounting region 260a is a region on which the substrate W is placed. The substrate mounting region 260a has an approximately disc shape. The outer peripheral region 260b is an approximately annular plate shaped region, and extends so as to surround the substrate mounting region 260a. The back surface (surface on the dielectric layer 24 side) of the substrate mounting region 260a and the back surface (surface on the dielectric layer 24 side) of the outer peripheral region 260b form a continuous flat back surface (bottom surface) of the ceramic main body 260, that is, the back surface of the chuck main body 26A. On the other hand, the upper surface of the outer peripheral region 260b extends closer to the back surface of the chuck main body 26A than the upper surface of the substrate mounting region 260a. On the outer peripheral region 260b, the focus ring FR is mounted so as to surround the edge of the substrate mounting region 260a and the edge of the substrate W.

Figure 4:
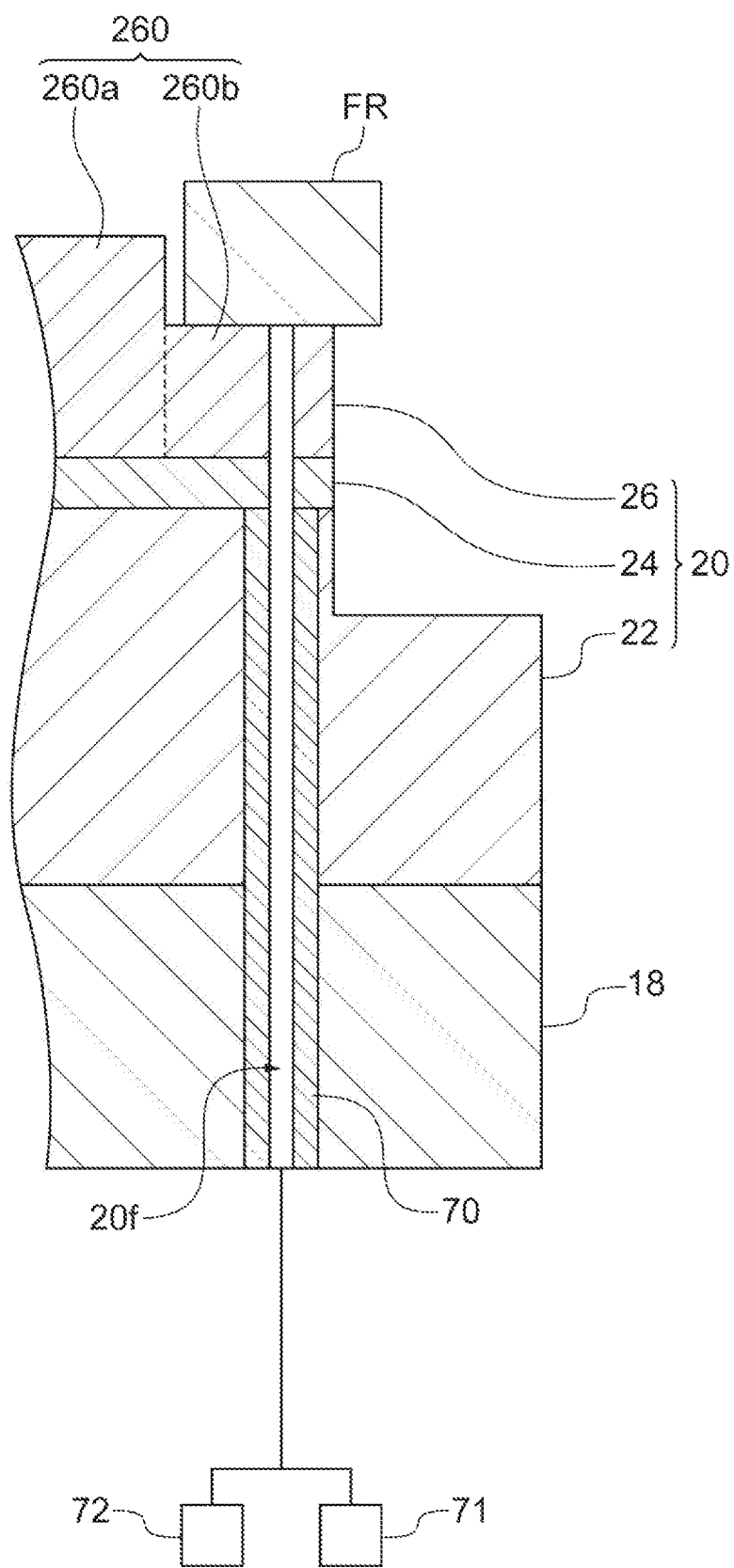
FIG. 4 is a cross-sectional view of an exemplary electrostatic chuck in a portion including an outer peripheral region of an chuck main body thereof.

FIG. 4 is a cross-sectional view of an exemplary electrostatic chuck in a portion including an outer peripheral region of an chuck main body thereof. As shown in FIG. 4, in an embodiment, a flow channel 20f (first flow channel) opened on the surface (upper surface) of the outer peripheral region 260b on a side opposite to the dielectric layer 24 is formed in the outer peripheral region 260b of the chuck main body 26A, the dielectric layer 24, the base 22, and the electrode plate 18. The flow channel 20f is provided by an insulating pipe 70 inside the electrode plate 18 and the base 22. A gas supply unit 71 (first gas supply unit) and an exhaust device 72 (first exhaust device) are selectively connected to the flow channel 20f. The gas supply unit 71 supplies gas to the back surface (bottom surface) of the focus ring FR through the flow channel 20f. The exhaust device 72 vacuums the back surface of the focus ring FR through the flow channel 20f.

Referring to FIG. 2 again, the first electrode 261 is provided in the substrate mounting region 260a. The first electrode 261 is a film-shaped electrode. The first electrode 261 is connected to a DC power supply DS1 (first DC power supply) through a switch SW1. The DC power supply DS1 generates a DC voltage applied to the first electrode 261. In a case where a DC voltage from the DC power supply DS1 is applied to the first electrode 261 during plasma generation, an electrostatic attractive force is generated between the chuck main body 26A and the substrate W that receives charges from the plasma. Due to the generated electrostatic attractive force, the substrate W is attracted to the chuck main body 26A and fixed to the chuck main body 26A.

Figure 5:
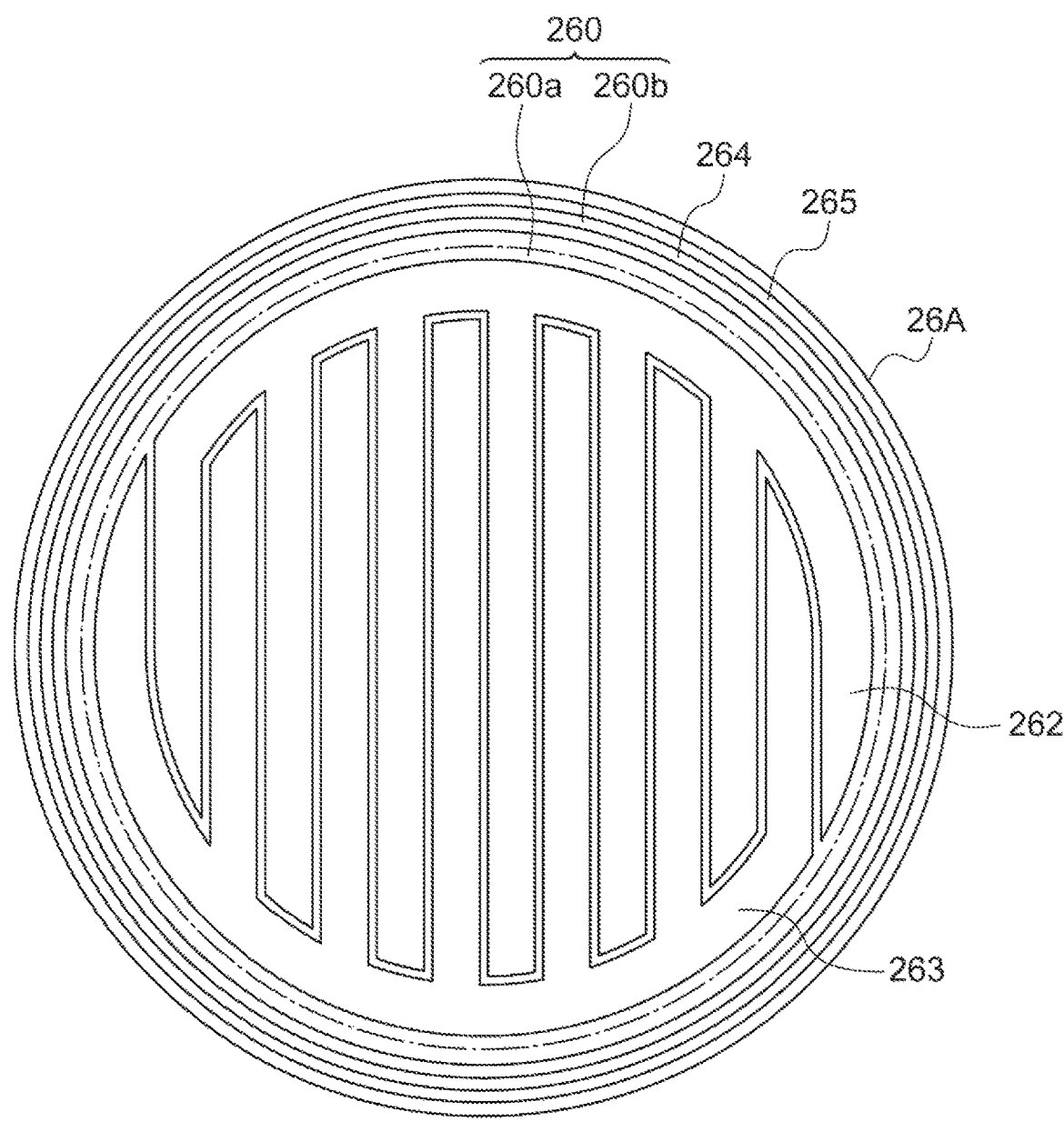
FIG. 5 illustrates second to fifth electrodes of the electrostatic chuck according to the first exemplary embodiment.

Hereinafter, FIG. 5 will be referred to together with FIG. 2. FIG. 5 illustrates the second to fifth electrodes of the electrostatic chuck according to the first exemplary embodiment. In FIG. 5, the second to fifth electrodes are shown at the same horizontal level for the sake of convenience. However, in the electrostatic chuck 20A, the fourth electrode 264 and the fifth electrode 265 are formed above the second electrode 262 and the third electrode 263.

As shown in FIGS. 2 and 5, the second electrode 262 and the third electrode 263 are provided in the substrate mounting region 260a of the ceramic main body 260. The second electrode 262 and the third electrode 263 form a bipolar electrode. The fourth electrode 264 and the fifth electrode 265 are provided in the outer peripheral region 260b. The fourth electrode 264 and the fifth electrode 265 form a bipolar electrode. The fourth electrode 264 and the fifth electrode 265 are farther from the dielectric layer 24 than the second electrode 262 and the third electrode 263. In other words, the second electrode 262 and the third electrode 263 are provided closer to the dielectric layer 24 in the ceramic main body 260 than the fourth electrode 264 and the fifth electrode 265, that is, close to the back surface of the ceramic main body 260.

Figure 6:
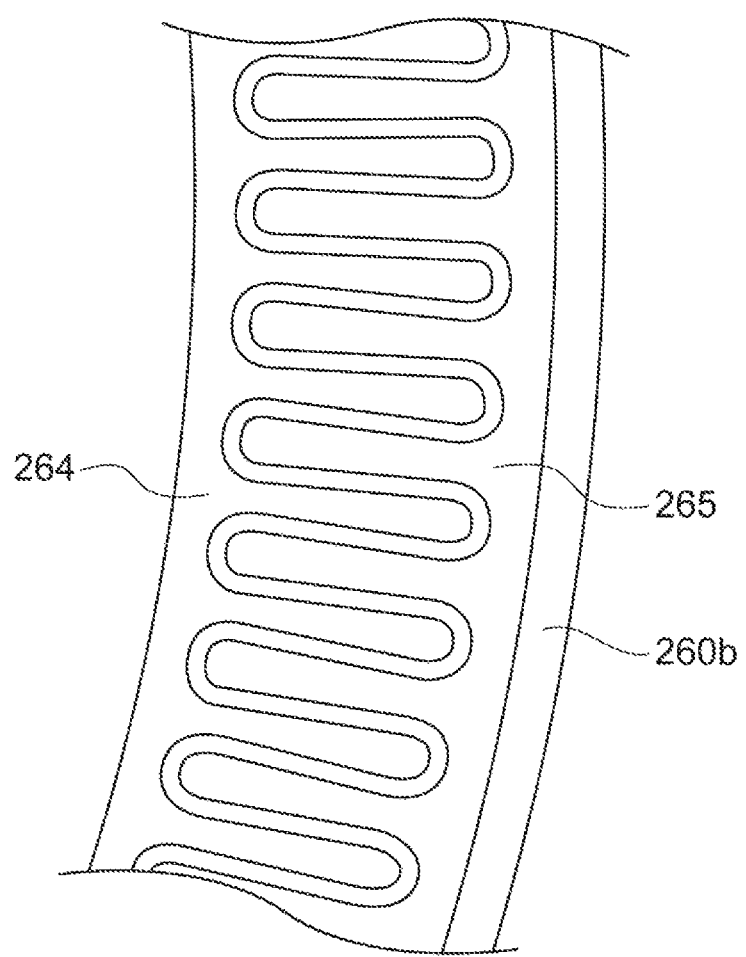
FIG. 6 is a plan view showing another example of the fourth electrode and the fifth electrode.

The second electrode 262 and the third electrode 263 are film-shaped electrodes, and have comb-tooth shapes as shown in FIG. 5. The second electrode 262 and the third electrode 263 are provided so that their comb teeth are alternately arranged along one direction. The fourth electrode 264 and the fifth electrode 265 are film-shaped electrodes, and have concentric ring shapes as shown in FIG. 5. FIG. 6 is a plan view showing another example of the fourth electrode and the fifth electrode. As shown in FIG. 6, the fourth electrode 264 and the fifth electrode 265 may have comb teeth shapes, and may be provided so that their comb teeth are alternately arranged along the circumferential direction.

Referring to FIG. 2 again, a DC power supply DS2 (second DC power supply) is electrically connected to the second electrode 262 through a switch SW2. A DC power supply DS3 (third DC power supply) is electrically connected to the third electrode 263 through a switch SW3. A DC power supply DS4 (fourth DC power supply) is electrically connected to the fourth electrode 264 through a switch SW4. A DC power supply DS5 (fifth DC power supply) is electrically connected to the fifth electrode 265 through a switch SW5.

The DC power supply DS2 generates a voltage applied to the second electrode 262. The DC power supply DS3 generates a voltage applied to the third electrode 263. The voltage applied from the DC power supply DS2 to the second electrode 262 and the voltage applied from the DC power supply DS3 to the third electrode 263 have opposite polarities. In a case where a voltage is applied from the DC power supply DS2 to the second electrode 262 and a voltage is applied from the DC power supply DS3 to the third electrode 263, an electrostatic attractive force is generated between the chuck main body 26A and the dielectric layer 24. Due to the generated electrostatic attractive force, the chuck main body 26A is attracted to the dielectric layer 24. By applying a voltage from the DC power supply DS2 to the second electrode 262 and applying a voltage from the DC power supply DS3 to the third electrode 263, it is possible to generate an electrostatic attractive force between the chuck main body 26A and the dielectric layer 24 even without a plasma, that is, even in a state in which no plasma is generated. Therefore, it is possible to attract the chuck main body 26A to the dielectric layer 24 at an arbitrary timing.

The DC power supply DS4 generates a voltage applied to the fourth electrode 264. The DC power supply DS5 generates a voltage applied to the fifth electrode 265. The voltage applied from the DC power supply DS4 to the fourth electrode 264 and the voltage applied from the DC power supply DS5 to the fifth electrode 265 have opposite polarities. In a case where a voltage is applied from the DC power supply DS4 to the fourth electrode 264 and a voltage is applied from the DC power supply DS5 to the fifth electrode 265, an electrostatic attractive force is generated between the chuck main body 26A and the focus ring FR. Due to the generated electrostatic attractive force, the focus ring FR is attracted to the chuck main body 26A and fixed to the chuck main body 26A. By applying a voltage from the DC power supply DS4 to the fourth electrode 264 and applying a voltage from the DC power supply DS5 to the fifth electrode 265, it is possible to generate an electrostatic attractive force between the chuck main body 26A and the focus ring FR even without a plasma, that is, even in a state in which no plasma is generated. Therefore, it is possible to attract the focus ring FR to the chuck main body 26A at an arbitrary timing.

Figure 7:
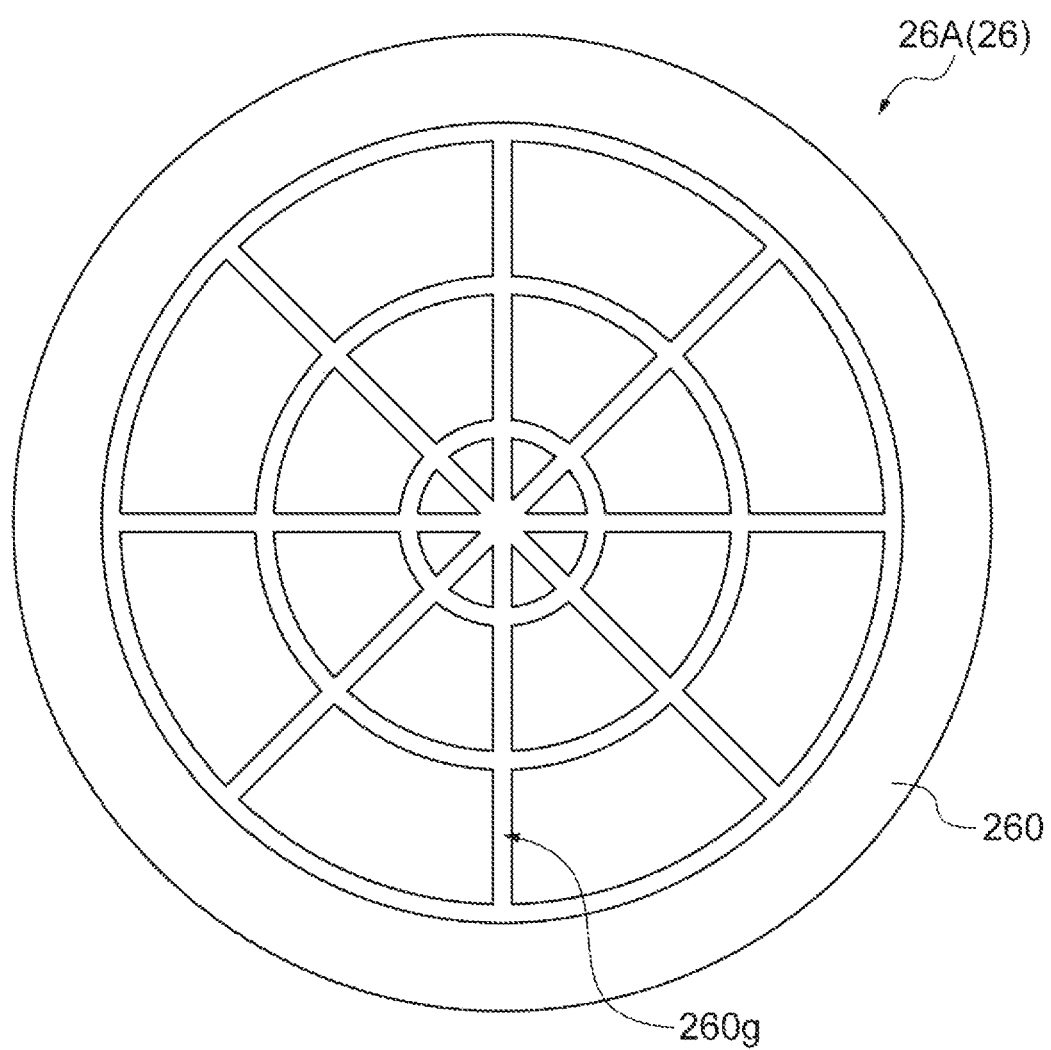
FIG. 7 is a plan view showing an example of the back surface of the chuck main body.

FIG. 7 is a plan view showing an example of the back surface of the chuck main body. As shown in FIGS. 2 and 7, the back surface of the chuck main body 26A, that is, the back surface of the ceramic main body 260 provides a groove 260g. In one example, the groove 260g extends along a plurality of concentric circles and a plurality of line segments extending radially from the center of the concentric circles. In the dielectric layer 24, the base 22, and the electrode plate 18, a flow channel 20g (second flow channel) connected to the groove 260g is formed. At least a part of the flow channel 20g is provided by a pipe. A gas supply unit 73 (second gas supply unit) and an exhaust device 74 (second exhaust device) are selectively connected to the flow channel 20g. The gas supply unit 73 supplies gas to the groove 260g through the flow channel 20g. The exhaust device 74 vacuums the back surface of the chuck main body 26A through the flow channel 20g and the groove 260g. The groove 260g may be formed on the surface of the dielectric layer 24 on a side of the chuck main body 26A.

As shown in FIG. 2, a temperature sensor 76 and a temperature sensor 77 are provided in the electrostatic chuck 20A. The temperature sensor 76 (second temperature sensor) is configured to measure the temperature of the chuck main body 26A. The temperature sensor 76 may be any temperature sensor, such as a fluorescent thermometer or a thermocouple. The temperature measurement value of the chuck main body 26A measured by the temperature sensor 76 is transmitted to the controller Cnt. The temperature sensor 77 (first temperature sensor) is configured to measure the temperature of the base 22. The temperature sensor 77 may be any temperature sensor, such as a fluorescent thermometer or a thermocouple. The temperature measurement value of the base 22 measured by the temperature sensor 77 is transmitted to the controller Cnt.

Electrostatic Chuck of a Second Exemplary Embodiment

Figure 8:
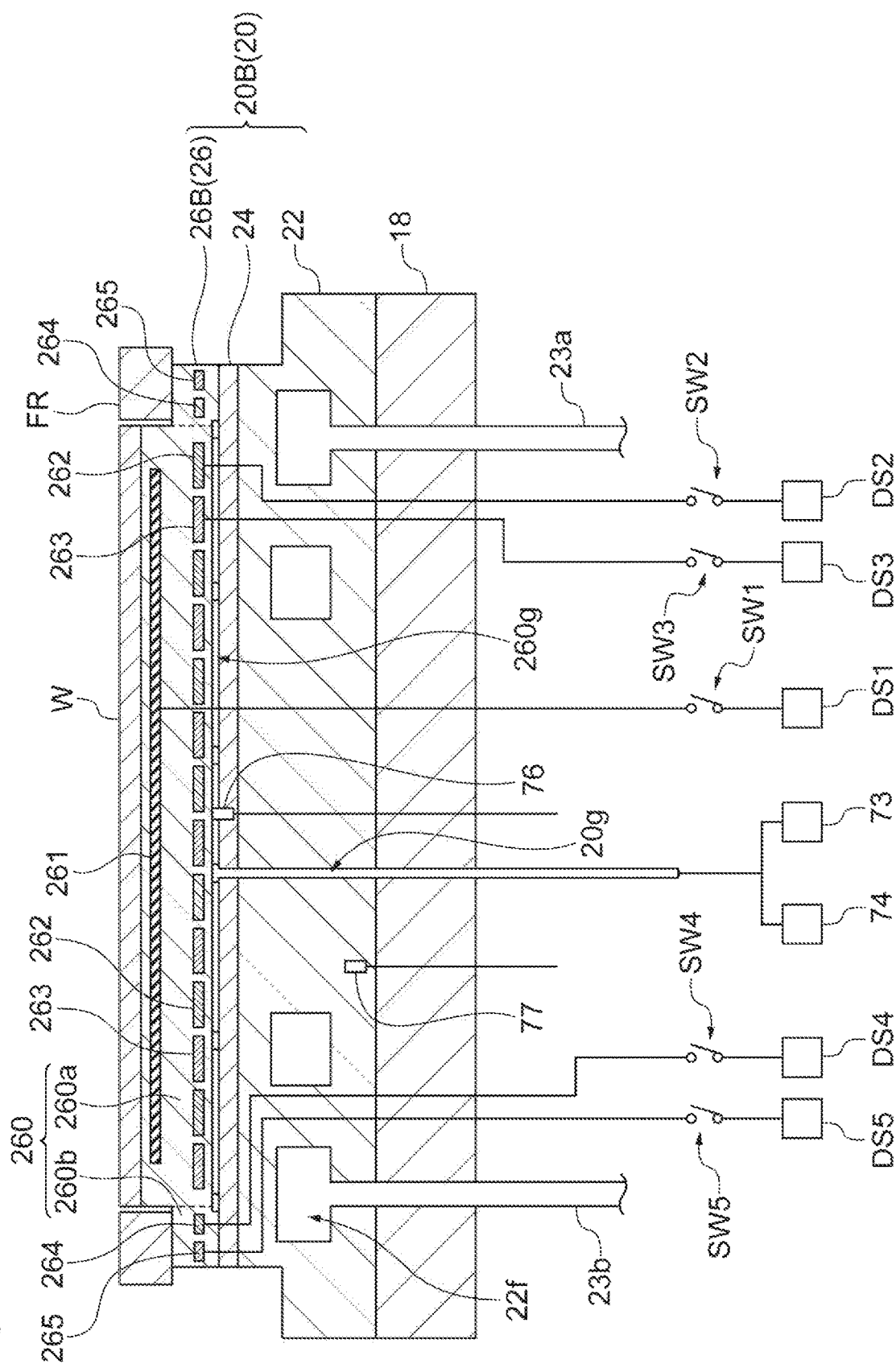
FIG. 8 is a cross-sectional view of an electrostatic chuck according to a second exemplary embodiment.

FIG. 8 is a cross-sectional view of an electrostatic chuck according to a second exemplary embodiment. An electrostatic chuck 20B of the second embodiment shown in FIG. 8 can be used as the electrostatic chuck 20 of the plasma processing apparatus 10. The electrostatic chuck 20B has a chuck main body 26B instead of the chuck main body 26A. The chuck main body 26B is different from the chuck main body 26A in terms of the position of the electrode in the ceramic main body 260. In the ceramic main body 260 of the chuck main body 26B, the second electrode 262, the third electrode 263, the fourth electrode 264, and the fifth electrode 265 are formed along the same plane. That is, a distance from the second electrode 262 to the back surface of the ceramic main body 260, a distance from the third electrode 263 to the back surface of the ceramic main body 260, a distance from the fourth electrode 264 to the back surface of the ceramic main body 260, and a distance from the fifth electrode 265 to the back surface of the ceramic main body 260 are the same. In other respects, the electrostatic chuck 20B has the same configuration as the electrostatic chuck 20A.

Electrostatic Chuck of a Third Exemplary Embodiment

Figure 9:
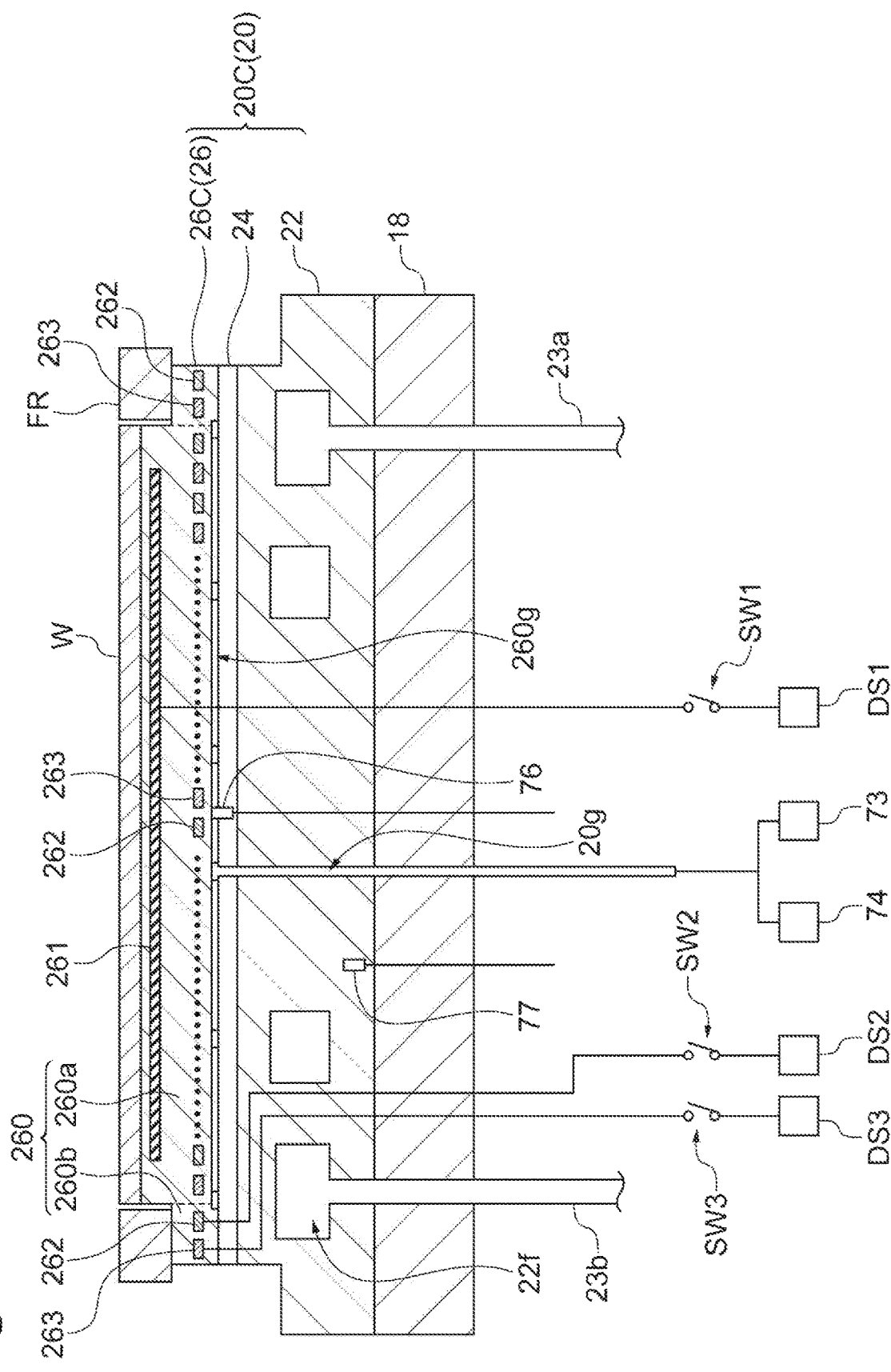
FIG. 9 is a cross-sectional view of an electrostatic chuck according to a third exemplary embodiment.

FIG. 9 is a cross-sectional view of an electrostatic chuck according to a third exemplary embodiment. An electrostatic chuck 20C of the third exemplary embodiment shown in FIG. 9 can be used as the electrostatic chuck 20 of the plasma processing apparatus 10. Hereinafter, how the electrostatic chuck 20C is different from the electrostatic chuck 20A and the electrostatic chuck 20B will be described. The electrostatic chuck 20C has a chuck main body 26C instead of the chuck main body 26A and the chuck main body 26B. The chuck main body 26C does not have the fourth electrode and the fifth electrode. In the ceramic main body 260 of the chuck main body 26C, the first electrode 261, the second electrode 262, and the third electrode 263 are provided.

Figure 10:
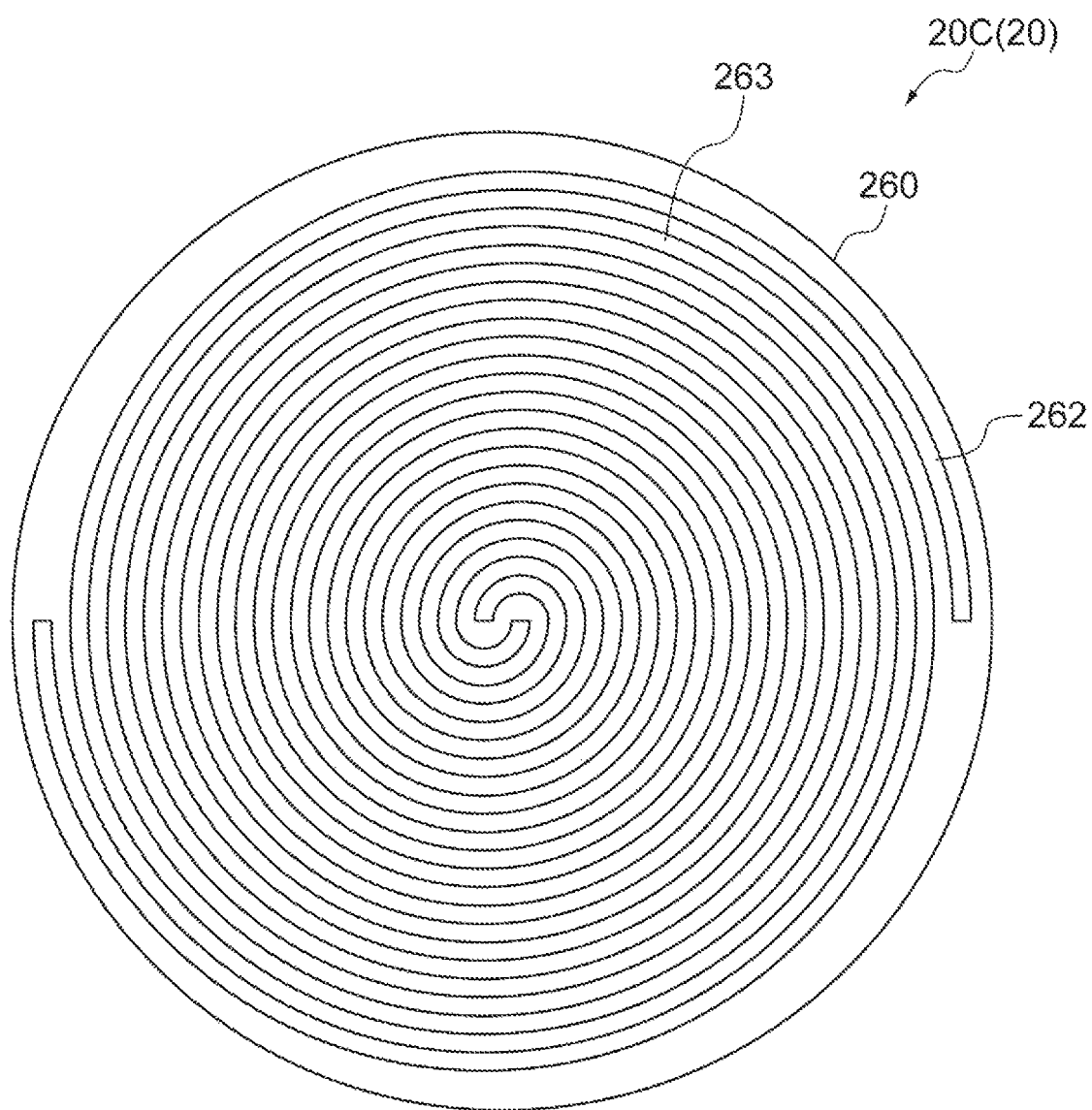
FIG. 10 illustrates the second and third electrodes of the electrostatic chuck according to the third embodiment.

FIG. 10 illustrates the second and third electrodes of the electrostatic chuck according to the third embodiment. As shown in FIGS. 9 and 10, in the chuck main body 26C, the second electrode 262 and the third electrode 263 are film-shaped electrodes, and extend spirally in the ceramic main body 260. In the chuck main body 26C, the second electrode 262 and the third electrode 263 are provided along the same plane. In the chuck main body 26C, the second electrode 262 and the third electrode 263 are provided across the substrate mounting region 260a and the outer peripheral region 260b.

According to the electrostatic chuck 20C, by applying voltages with opposite polarities from the DC power supply DS2 and the DC power supply DS3 to the second electrode 262 and the third electrode 263, the chuck main body 26C is attracted to the dielectric layer 24 and the focus ring FR is attracted to the chuck main body 26C.

In the electrostatic chuck 20 that is any of the electrostatic chucks 20A, 20B, and 20C described above, an electrostatic attractive force is generated between the chuck main body 26 and the substrate W by applying a voltage to the first electrode 261. Due to the generated electrostatic attractive force, the substrate W is held on the chuck main body 26. In addition, an electrostatic attractive force is generated between the chuck main body 26 and the dielectric layer 24 by applying voltages with opposite polarities to the second electrode 262 and the third electrode 263. Due to the generated electrostatic attractive force, the chuck main body 26 is attracted to the dielectric layer 24, fixed to the dielectric layer 24, and fixed to the base 22 via the dielectric layer 24. Therefore, according to the electrostatic chuck 20, the chuck main body 26 is fixed to the base 22 without using an adhesive. In a case where a temperature difference occurs between the base 22 and the chuck main body 26, the chuck main body 26 can be fixed to the base 22 via the dielectric layer 24 by the electrostatic attractive force, after the temperature difference between the temperature of the base 22 and the temperature of the chuck main body 26 is reduced. Therefore, it is possible to suppress the peeling of the chuck main body 26 and the cracking of the chuck main body 26. In addition, it is possible to suppress the warpage of the electrostatic chuck 20.

Even if the focus ring FR is attracted to the outer peripheral region 260b of the chuck main body 26 due to residual charges or the like, the focus ring FR can be detached from the outer peripheral region 260b of the chuck main body 26 by supplying gas to the flow channel 20f.

Even if the chuck main body 26 is attracted to the dielectric layer 24 due to residual charges or the like, the chuck main body 26 can be detached from the dielectric layer 24 by supplying gas to the flow channel 20g.

Figure 11:
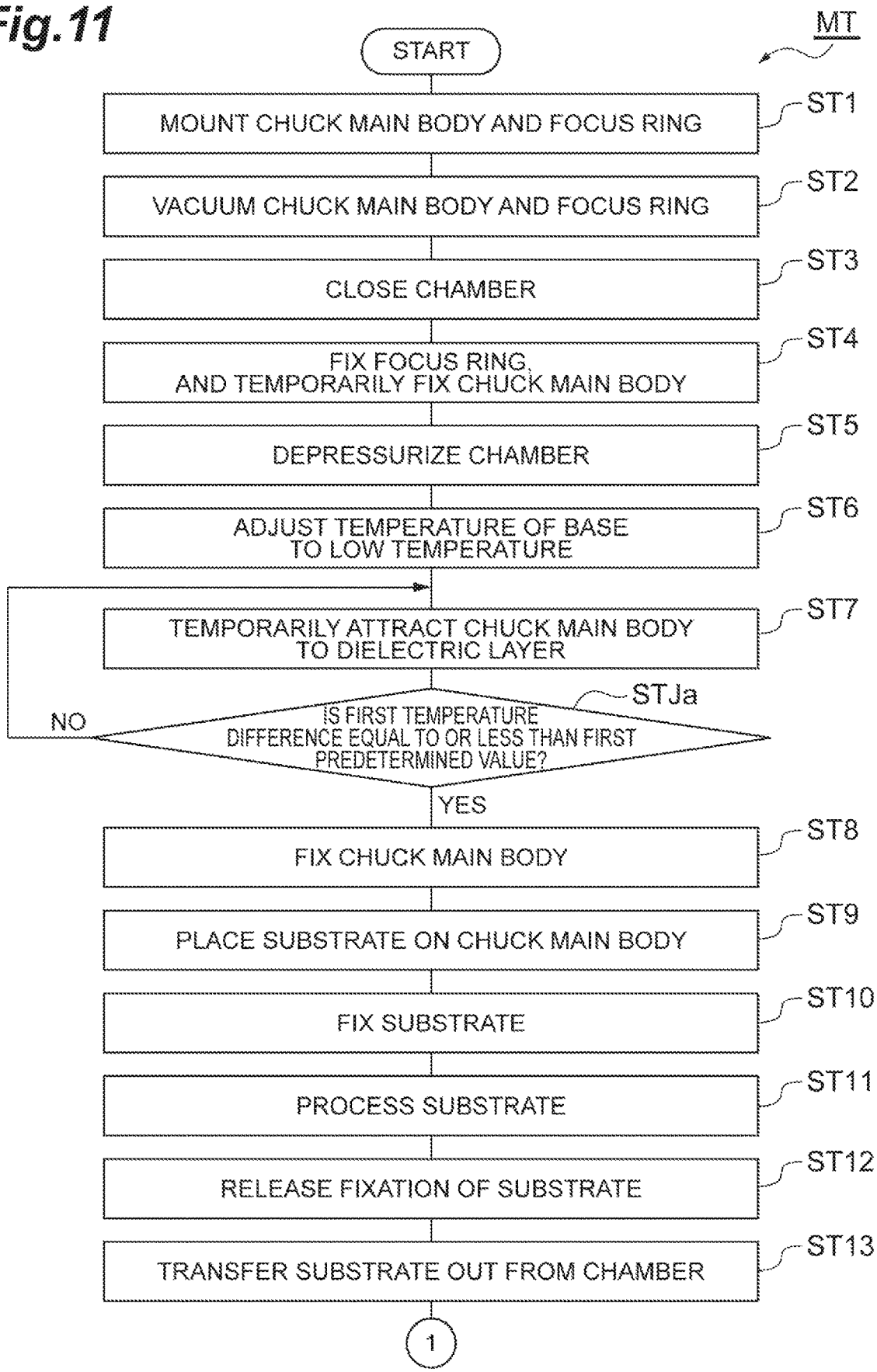
FIG. 11 is a flowchart showing a method of operating an electrostatic chuck of a plasma processing apparatus according to an exemplary embodiment.
Figure 12:
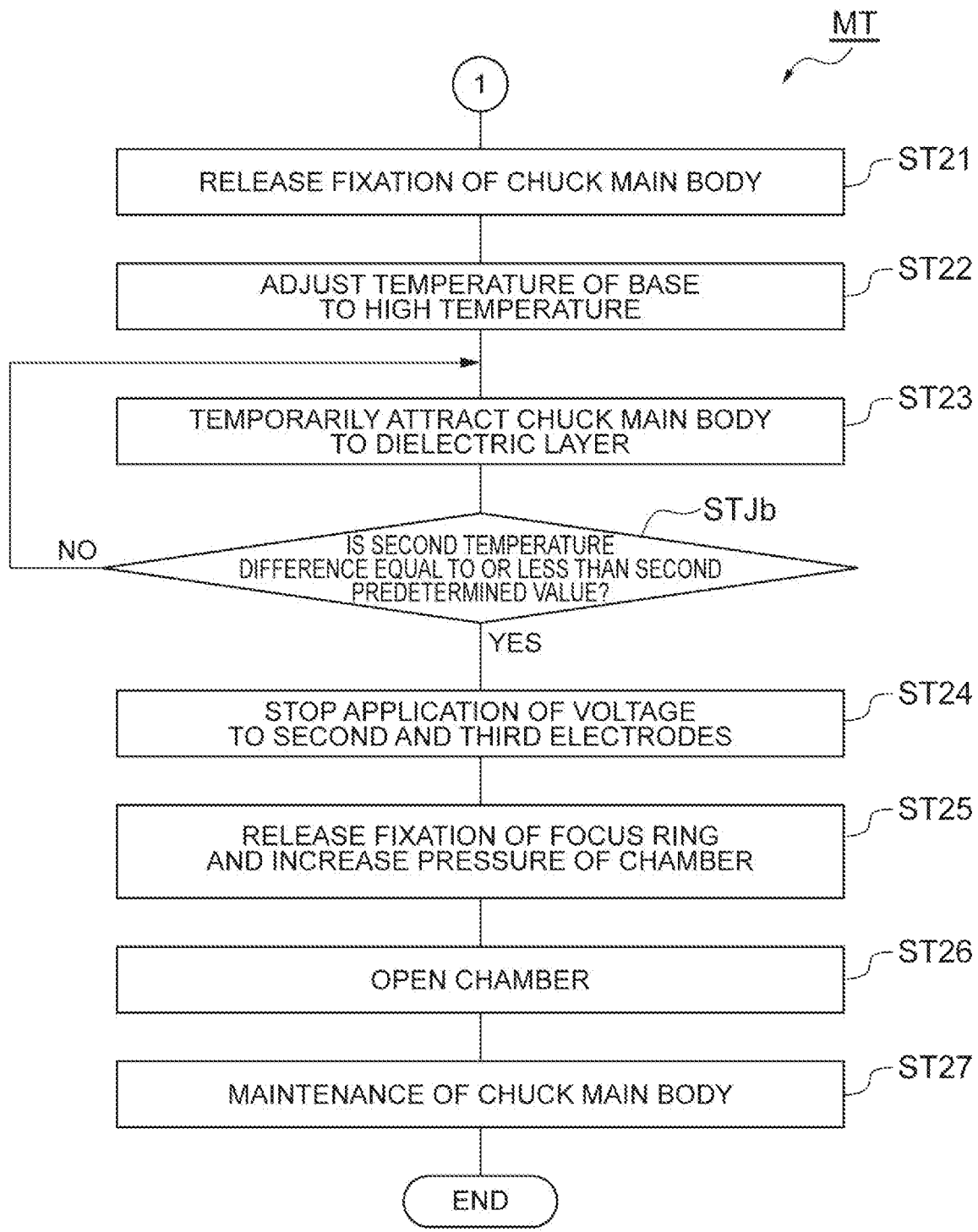
FIG. 12 is a flowchart showing the method of operating an electrostatic chuck of a plasma processing apparatus according to the exemplary embodiment.
Figure 13:
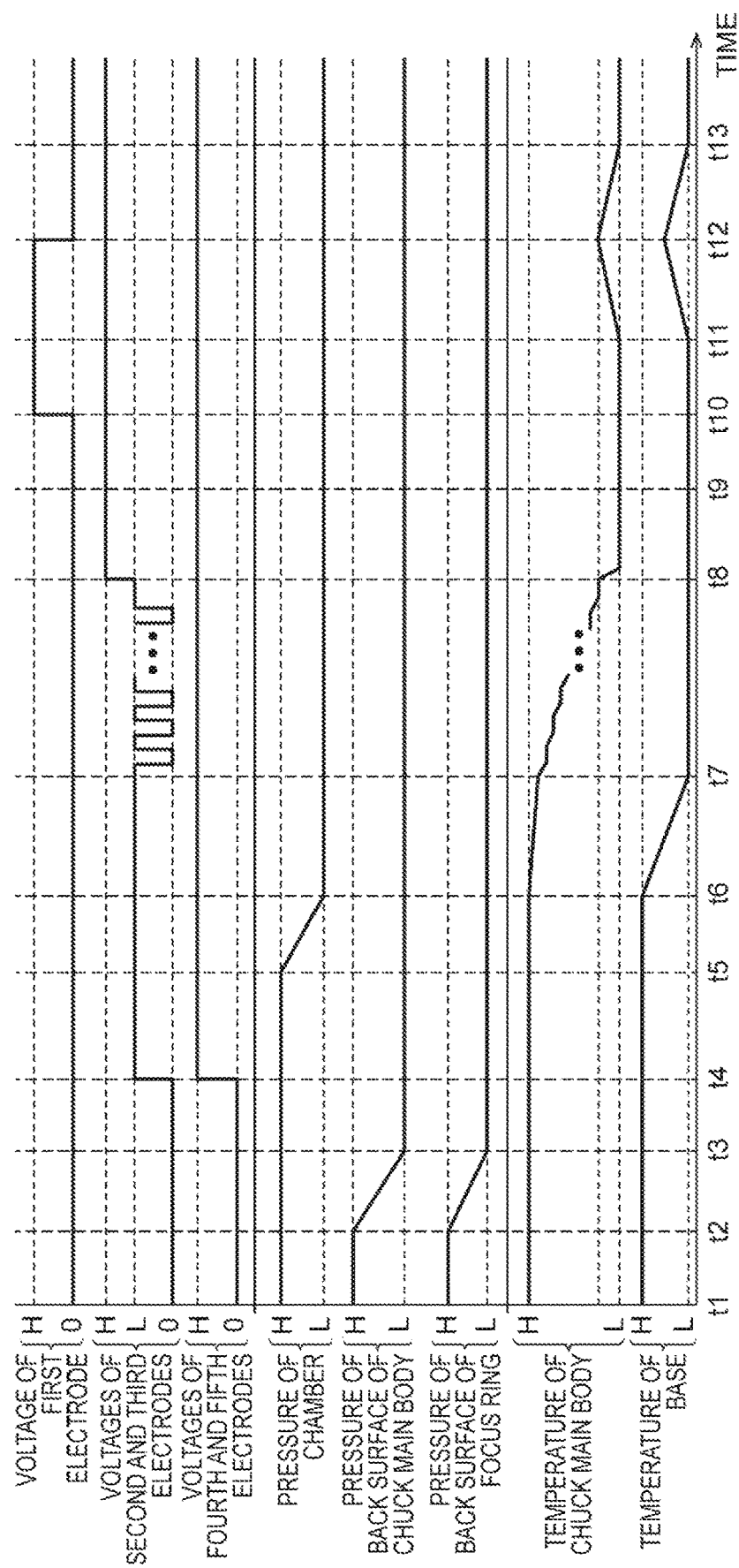
FIG. 13 is an exemplary timing chart relevant to the method shown in FIGS. 11 and 12.
Figure 14:
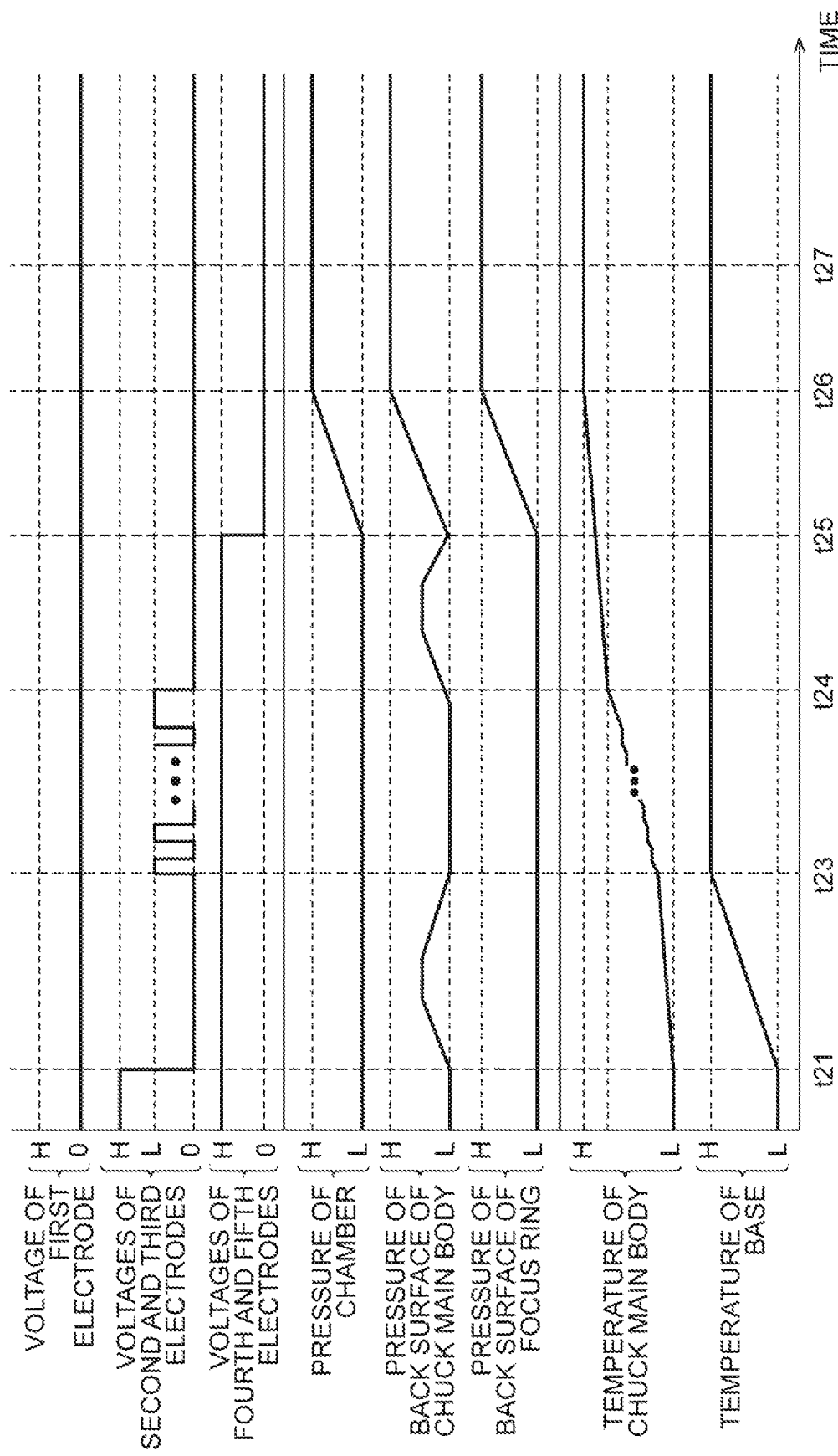
FIG. 14 is an exemplary timing chart relevant to the method shown in FIGS. 11 and 12.

Hereinafter, embodiments of a method of operating the electrostatic chuck 20 of the plasma processing apparatus 10 will be described. FIGS. 11 and 12 are flowcharts showing the method of operating an electrostatic chuck of a plasma processing apparatus according to an exemplary embodiment. FIGS. 13 and 14 are exemplary timing charts relevant to the method shown in FIGS. 11 and 12. In the timing charts shown in FIGS. 13 and 14, the horizontal axis indicates time. In the timing charts shown in FIGS. 13 and 14, the vertical axis indicates the voltage of the first electrode 261, the voltage of the second electrode 262 and the voltage of the third electrode 263, the voltage of the fourth electrode 264 and the voltage of the fifth electrode 265, the pressure of the chamber 12c, the pressure of the back surface of the chuck main body 26, the pressure of the back surface of the focus ring FR, the temperature of the chuck main body 26, and the temperature of the base 22.

In the timing charts relevant to the voltage of the first electrode 261 in FIGS. 13 and 14, "0" indicates that no voltage is applied to the first electrode 261, and "H" indicates that a voltage is applied to the first electrode 261. In the timing chart relevant to the voltage of the second electrode 262 and the voltage of the third electrode 263, "0" indicates that no voltage is applied to the second electrode 262 and the third electrode 263, "L" indicates that a voltage having a small absolute value is applied to each of the second electrode 262 and the third electrode 263, and "H" indicates that a voltage having a large absolute value is applied to each of the second electrode 262 and the third electrode 263. In the timing charts relevant to the voltage of the fourth electrode 264 and the voltage of the fifth electrode 265, "0" indicates that no voltage is applied to the fourth electrode 264 and the fifth electrode 265, and "H" indicates that a voltage is applied to each of the fourth electrode 264 and the fifth electrode 265. In the timing charts relevant to the pressure of the chamber 12c, "L" indicates that the pressure of the chamber 12c is low, and "H" indicates that the pressure of the chamber 12c is high. In the timing charts relevant to the pressure of the back surface of the chuck main body 26, "L" indicates that the pressure of the back surface of the chuck main body 26 is low, and "H" indicates that the pressure of the back surface of the chuck main body 26 is high. In the timing charts relevant to the pressure of the back surface of the focus ring FR, "L" indicates that the pressure of the back surface of the focus ring FR is low, and "H" indicates that the pressure of the back surface of the focus ring FR is high. In the timing charts relevant to the temperature of the chuck main body 26, "L" indicates that the temperature of the chuck main body 26 is low, and "H" indicates that the temperature of the chuck main body 26 is high. In the timing charts relevant to the temperature of the base 22, "L" indicates that the temperature of the base 22 is low, and "H" indicates that the temperature of the base 22 is high.

A method MT can be executed by controlling each unit of the plasma processing apparatus 10 by the controller Cnt. The method MT can be executed in the plasma processing apparatus 10 having the electrostatic chuck 20A or the electrostatic chuck 20B as the electrostatic chuck 20. However, in a case where the application of the voltage to the fourth electrode 264 and the fifth electrode 265 is not performed independently of the application of the voltage to the second electrode 262 and the third electrode 263, the method MT can also be executed in the plasma processing apparatus 10 having the electrostatic chuck 20C as the electrostatic chuck 20.

The method MT starts in step ST1. In step ST1, the chuck main body 26 is mounted on the dielectric layer 24, and the focus ring FR is mounted on the outer peripheral region 260b of the chuck main body 26. In the execution period (period from time t1 to time t2 shown in FIG. 13) of step ST1, no voltage is applied to each of the first electrode 261, the second electrode 262, the third electrode 263, the fourth electrode 264, and the fifth electrode 265. In the execution period of step ST1, the chamber 12c is not depressurized. Accordingly, the pressure of the chamber 12c is relatively high. For example, the pressure of the chamber 12c is set to atmospheric pressure. In the execution period of step ST1, the flow channel 20g and the groove 260g are not depressurized by the exhaust device 74. Accordingly the pressure of the back surface of the chuck main body 26 is relatively high. In the execution period of step ST1, the flow channel 20f is not depressurized by the exhaust device 72. Accordingly the pressure of the back surface of the focus ring FR is high. In addition, in the execution period of step ST1, a low-temperature heat exchange medium is not supplied to the flow channel 22f. Accordingly, the temperature of the base 22 and the temperature of the chuck main body 26 are set to relatively high temperatures.

In subsequent step ST2, the back surface of the chuck main body 26 and the back surface of the focus ring FR are vacuumed. In the execution period (period from time t2 to time t3 shown in FIG. 13) of step ST2, no voltage is applied to each of the first electrode 261, the second electrode 262, the third electrode 263, the fourth electrode 264, and the fifth electrode 265. In the execution period of step ST2, the chamber 12c is not depressurized. Accordingly, the pressure of the chamber 12c is relatively high. In the execution period of step ST2, the flow channel 20g and the groove 260g are depressurized by the exhaust device 74. Accordingly, the back surface of the chuck main body 26 is vacuumed. In the execution period of step ST2, the flow channel 20f is depressurized by the exhaust device 72. Accordingly, the back surface of the focus ring FR is vacuumed. In addition, in the execution period of step ST2, a low-temperature heat exchange medium is not supplied to the flow channel 22f. Accordingly, the temperature of the base 22 and the temperature of the chuck main body 26 are set to relatively high temperatures.

In subsequent step ST3, the passage 12g is closed by the gate valve 14, and the chamber 12c is closed. In the execution period (period from time t3 to time t4 shown in FIG. 13) of step ST3, no voltage is applied to each of the first electrode 261, the second electrode 262, the third electrode 263, the fourth electrode 264, and the fifth electrode 265. In the execution period of step ST3, the chamber 12c is not depressurized. Accordingly, the pressure of the chamber 12c is relatively high. In the execution period of step ST3, the flow channel 20g and the groove 260g are depressurized by the exhaust device 74. In the execution period of step ST3, the flow channel 20f is depressurized by the exhaust device 72. In addition, in the execution period of step ST3, a low-temperature heat exchange medium is not supplied to the flow channel 22f. Accordingly, the temperature of the base 22 and the temperature of the chuck main body 26 are set to relatively high temperatures.

In subsequent step ST4, the focus ring FR is fixed to the chuck main body 26, and the chuck main body 26 is temporarily fixed to the base 22 with the dielectric layer 24 interposed therebetween. In the execution period (period from time t4 to time t5 shown in FIG. 13) of step ST4, no voltage is applied to the first electrode 261. In the execution period of step ST4, a voltage whose absolute value is relatively small is applied from the DC power supply DS2 to the second electrode 262, and a voltage whose absolute value is relatively small is applied from the DC power supply DS3 to the third electrode 263. Therefore, in the execution period of step ST4, the chuck main body 26 is attracted to the dielectric layer 24 by the relatively small electrostatic attractive force. In the execution period of step ST4, a voltage is applied from the DC power supply DS4 to the fourth electrode 264, and a voltage is applied from the DC power supply DS5 to the fifth electrode 265. Therefore, an electrostatic attractive force is generated between the outer peripheral region 260b of the chuck main body 26 and the focus ring FR, and the focus ring FR is attracted to the outer peripheral region 260b of the chuck main body 26 and fixed to the chuck main body 26. In the execution period of step ST4, the chamber 12c is not depressurized. Accordingly, the pressure of the chamber 12c is relatively high. In the execution period of step ST4, the flow channel 20g and the groove 260g are depressurized by the exhaust device 74. In the execution period of step ST4, the flow channel 20f is depressurized by the exhaust device 72. In addition, in the execution period of step ST4, a low-temperature heat exchange medium is not supplied to the flow channel 22f. Accordingly, the temperature of the base 22 and the temperature of the chuck main body 26 are set to relatively high temperatures.

In subsequent step ST5, the chamber 12c is depressurized. In the execution period (period from time t5 to time t6 shown in FIG. 13) of step ST5, no voltage is applied to the first electrode 261. In the execution period of step ST5, continuing from step ST4, a voltage whose absolute value is relatively small is applied from the DC power supply DS2 to the second electrode 262, and a voltage whose absolute value is relatively small is applied from the DC power supply DS3 to the third electrode 263. In the execution period of step ST5, continuing from step ST4, a voltage is applied from the DC power supply DS4 to the fourth electrode 264, and a voltage is applied from the DC power supply DS5 to the fifth electrode 265. In the execution period of step ST5, the chamber 12c is depressurized by the exhaust device 50. Accordingly, the pressure of the chamber 12c is set to low pressure. In the execution period of step ST5, the flow channel 20g and the groove 260g are depressurized by the exhaust device 74. In the execution period of step ST5, the flow channel 20f is depressurized by the exhaust device 72. In addition, in the execution period of step ST5, a low-temperature heat exchange medium is not supplied to the flow channel 22f. Accordingly, the temperature of the base 22 and the temperature of the chuck main body 26 are set to relatively high temperatures.

In subsequent step ST6, the temperature of the base 22 is adjusted to a low temperature (lowered temperature). In the execution period (period from time t6 to time t7 shown in FIG. 13) of step ST6, no voltage is applied to the first electrode 261. In the execution period of step ST6, continuing from step ST5, a voltage whose absolute value is relatively small is applied from the DC power supply DS2 to the second electrode 262, and a voltage whose absolute value is relatively small is applied from the DC power supply DS3 to the third electrode 263. In the execution period of step ST6, continuing from step ST5, a voltage is applied from the DC power supply DS4 to the fourth electrode 264, and a voltage is applied from the DC power supply DS5 to the fifth electrode 265. In the execution period of step ST6, the chamber 12c is depressurized by the exhaust device 50. Accordingly, the pressure of the chamber 12c is set to low pressure. In the execution period of step ST6, the flow channel 20g and the groove 260g are depressurized by the exhaust device 74. In the execution period of step ST6, the flow channel 20f is depressurized by the exhaust device 72. At the start of the execution period of step ST6, the supply of a low-temperature heat exchange medium to the flow channel 22f is initiated. Therefore, in the execution period of step ST6, the temperature of the base 22 quickly decreases. In addition, in the execution period of step ST6, the temperature of the chuck main body 26 decreases at a relatively low speed. The supply of the low-temperature heat exchange medium to the flow channel 22f is continued during a period from the start (time t6 shown in FIG. 13) of step ST6 to the start (time t21 shown in FIG. 14) of step ST21 to be described later.

In subsequent step ST7, the chuck main body 26 is temporarily attracted to the dielectric layer 24. In the execution period (period from time t7 to time t8 shown in FIG. 13) of step ST7, no voltage is applied to the first electrode 261. In the execution period of step ST7, a voltage (first voltage) whose absolute value is relatively small is applied from the DC power supply DS2 to the second electrode 262, and a voltage (second voltage) whose absolute value is relatively small is applied from the DC power supply DS3 to the third electrode 263. In one embodiment, in the execution period of step ST7, the first voltage is intermittently applied from the DC power supply DS2 to the second electrode 262, and the second voltage is intermittently applied from the DC power supply DS3 to the third electrode 263. For example, the application of the first voltage from the DC power supply DS2 to the second electrode 262 for several seconds and the stop of the application of the voltage to the second electrode 262 for several seconds are alternately performed, and the application of the second voltage from the DC power supply DS3 to the third electrode 263 for several seconds and the stop of the application of the voltage to the third electrode 263 for several seconds are alternately performed. In the execution period of step ST7, continuing from step ST6, a voltage is applied from the DC power supply DS4 to the fourth electrode 264, and a voltage is applied from the DC power supply DS5 to the fifth electrode 265. In the execution period of step ST7, the chamber 12c is depressurized by the exhaust device 50. In the execution period of step ST7, the flow channel 20g and the groove 260g are depressurized by the exhaust device 74. In the execution period of step ST7, the flow channel 20f is depressurized by the exhaust device 72. In addition, in the execution period of step ST7, continuing from step ST6, a low-temperature heat exchange medium is supplied to the flow channel 22f.

In the method MT, step STJa is executed during the execution of step ST7. In step STJa, a first determination is made as to whether or not the temperature difference (first temperature difference) between the temperature of the base 22 and the temperature of the chuck main body 26 is equal to or less than a first predetermined value. The temperature of the base 22 is measured by the temperature sensor 77, and the temperature of the chuck main body 26 is measured by the temperature sensor 76. The first predetermined value is a value within a range of, for example, 5° C. or more and 10° C. or less. In a case where it is determined that the first temperature difference is larger than the first predetermined value in step STJa, the execution of step ST7 is continued. On the other hand, in a case where it is determined that the first temperature difference is equal to or less than the first predetermined value in step STJa, step ST8 is executed.

In step ST8, the chuck main body 26 is fixed to the base 22 via the dielectric layer 24. In step ST8, an electrostatic attractive force is generated between the dielectric layer 24 and the chuck main body 26 in a state in which the temperature of the base 22 has been adjusted to a lowered temperature. In the execution period (period from time t8 to time t9 shown in FIG. 13) of step ST8, no voltage is applied to the first electrode 261. In the execution period of step ST8, a voltage (third voltage) whose absolute value is relatively large is applied from the DC power supply DS2 to the second electrode 262, and a voltage (fourth voltage) whose absolute value is relatively large is applied from the DC power supply DS3 to the third electrode 263. The absolute value of the first voltage is smaller than the absolute value of the third voltage, and the absolute value of the second voltage is smaller than the absolute value of the fourth voltage. The application of the third voltage to the second electrode 262 and the application of the fourth voltage to the third electrode 263 are continued during a period from the start (time t8 shown in FIG. 13) of step ST8 to the start (time t21 shown in FIG. 14) of step ST21 to be described later.

In the execution period of step ST8, continuing from step ST7, a voltage is applied from the DC power supply DS4 to the fourth electrode 264, and a voltage is applied from the DC power supply DS5 to the fifth electrode 265. In the execution period of step ST8, the chamber 12c is depressurized by the exhaust device 50. In the execution period of step ST8, the flow channel 20g and the groove 260g are depressurized by the exhaust device 74. In the execution period of step ST8, the flow channel 20f is depressurized by the exhaust device 72. In addition, in the execution period of step ST8, continuing from step ST7, a low-temperature heat exchange medium is supplied to the flow channel 22f.

In step subsequent ST9, the substrate W is placed on the substrate mounting region 260a of the chuck main body 26. In the execution period (period from time t9 to time t10 shown in FIG. 13) of step ST9, the passage 12g is opened by using the gate valve 14, and the substrate W is transferred into the chamber 12c and placed on the substrate mounting region 260a. Then, the passage 12g is closed by using the gate valve 14, to close the chamber 12c.

In the execution period of step ST9, no voltage is applied to the first electrode 261. In the execution period of step ST9, continuing from step ST8, the third voltage is applied from the DC power supply DS2 to the second electrode 262, and the fourth voltage is applied from the DC power supply DS3 to the third electrode 263. In the execution period of step ST9, continuing from step ST8, a voltage is applied from the DC power supply DS4 to the fourth electrode 264, and a voltage is applied from the DC power supply DS5 to the fifth electrode 265. In the execution period of step ST9, the chamber 12c is depressurized by the exhaust device 50. In the execution period of step ST9, the flow channel 20g and the groove 260g are depressurized by the exhaust device 74. In the execution period of step ST9, the flow channel 20f is depressurized by the exhaust device 72. In addition, in the execution period of step ST9, continuing from step ST8, a low-temperature heat exchange medium is supplied to the flow channel 22f.

In subsequent step ST10, the substrate W is fixed to the chuck main body 26. In the execution period (period from time t10 to time t11 shown in FIG. 13) of step ST10, a voltage is applied from the DC power supply DS1 to the first electrode 261. Therefore, an electrostatic attractive force is generated between the chuck main body 26 and the substrate W, and the substrate W is attracted to the chuck main body 26 and held on the chuck main body 26. The application of the voltage from the DC power supply DS1 to the first electrode 261 is continued from the start (time t10 shown in FIG. 13) of the execution period of step ST10 to the start (time t12 shown in FIG. 13) of the execution period of step ST12 to be described later.

In the execution period of step ST10, continuing from step ST9, the third voltage is applied from the DC power supply DS2 to the second electrode 262, and the fourth voltage is applied from the DC power supply DS3 to the third electrode 263. In the execution period of step ST10, continuing from step ST9, a voltage is applied from the DC power supply DS4 to the fourth electrode 264, and a voltage is applied from the DC power supply DS5 to the fifth electrode 265. In the execution period of step ST10, the chamber 12c is depressurized by the exhaust device 50. In the execution period of step ST10, the flow channel 20g and the groove 260g are depressurized by the exhaust device 74. In the execution period of step ST10, the flow channel 20f is depressurized by the exhaust device 72. In addition, in the execution period of step ST10, continuing from step ST9, a low-temperature heat exchange medium is supplied to the flow channel 22f.

In subsequent step ST11, the substrate W is processed. For example, a plasma of a processing gas is generated in the chamber 12c of the plasma processing apparatus 10, and the substrate W is processed by active species of molecules or atoms from the plasma. In the execution period (period from time t11 to time t12 shown in FIG. 13) of step ST11, continuing from step ST10, a voltage is applied from the DC power supply DS1 to the first electrode 261. In the execution period of step ST11, continuing from step ST10, the third voltage is applied from the DC power supply DS2 to the second electrode 262, and the fourth voltage is applied from the DC power supply DS3 to the third electrode 263. In the execution period of step ST11, continuing from step ST10, a voltage is applied from the DC power supply DS4 to the fourth electrode 264, and a voltage is applied from the DC power supply DS5 to the fifth electrode 265. In the execution period of step ST11, the chamber 12c is depressurized by the exhaust device 50. In the execution period of step ST11, the flow channel 20g and the groove 260g are depressurized by the exhaust device 74. In the execution period of step ST11, the flow channel 20f is depressurized by the exhaust device 72. In addition, in the execution period of step ST11, continuing from step ST10, a low-temperature heat exchange medium is supplied to the flow channel 22f. In a case where the plasma processing is performed, the temperature of the substrate W, the temperature of the chuck main body 26, and the temperature of the base 22 increase due to heat input from the plasma.

After the processing on the substrate W is ended, step ST12 is executed. In step ST12, the fixation of the substrate W by the chuck main body 26 is released. In the execution period (period from time t12 to time t13 shown in FIG. 13) of step ST12, the application of the voltage from the DC power supply DS1 to the first electrode 261 is stopped. In the execution period of step ST12, continuing from step ST11, the third voltage is applied from the DC power supply DS2 to the second electrode 262, and the fourth voltage is applied from the DC power supply DS3 to the third electrode 263. In the execution period of step ST12, continuing from step ST11, a voltage is applied from the DC power supply DS4 to the fourth electrode 264, and a voltage is applied from the DC power supply DS5 to the fifth electrode 265. In the execution period of step ST12, the chamber 12c is depressurized by the exhaust device 50. In the execution period of step ST12, the flow channel 20g and the groove 260g are depressurized by the exhaust device 74. In the execution period of step ST12, the flow channel 20f is depressurized by the exhaust device 72. In addition, in the execution period of step ST12, continuing from step ST11, a low-temperature heat exchange medium is supplied to the flow channel 22f.

In subsequent step ST13, the substrate W is transferred out from the chamber 12c. In the execution period (period starting from time t13 shown in FIG. 13) of step ST13, the passage 12g is opened by using the gate valve 14, and the substrate W is transferred out from the chamber 12c. Then, the passage 12g is closed by using the gate valve 14.

In the execution period of step ST13, continuing from step ST12, no voltage is applied to the first electrode 261. In the execution period of step ST13, continuing from step ST12, the third voltage is applied from the DC power supply DS2 to the second electrode 262, and the fourth voltage is applied from the DC power supply DS3 to the third electrode 263. In the execution period of step ST13, continuing from step ST12, a voltage is applied from the DC power supply DS4 to the fourth electrode 264, and a voltage is applied from the DC power supply DS5 to the fifth electrode 265. In the execution period of step ST13, the chamber 12c is depressurized by the exhaust device 50. In the execution period of step ST13, the flow channel 20g and the groove 260g are depressurized by the exhaust device 74. In the execution period of step ST13, the flow channel 20f is depressurized by the exhaust device 72. In addition, in the execution period of step ST13, continuing from step ST12, a low-temperature heat exchange medium is supplied to the flow channel 22f. In the method MT, the execution of steps ST9 to ST13 may be repeated in order to process a plurality of substrates W.

In the method MT, after the execution of step ST13, step ST21 is executed first as shown in FIG. 12 in order to maintain the chuck main body 26. In step ST21, the fixation of the chuck main body 26 to the base 22 is released. In the execution period (period from time t21 to time t23 shown in FIG. 14) of step ST21, no voltage is applied to the first electrode 261. In the execution period of step ST21, the application of the voltage from the DC power supply DS2 to the second electrode 262 is stopped, and the application of the voltage from the DC power supply DS3 to the third electrode 263 is stopped. In the execution period of step ST21, continuing from step ST13, a voltage is applied from the DC power supply DS4 to the fourth electrode 264, and a voltage is applied from the DC power supply DS5 to the fifth electrode 265. In the execution period of step ST21, the chamber 12c is depressurized by the exhaust device 50. In the execution period of step ST21, the flow channel 20f is depressurized by the exhaust device 72. In the execution period of step ST21, gas from the gas supply unit 73 is supplied to the flow channel 20g and the groove 260g. Therefore, the pressure on the back surface of the chuck main body 26 becomes higher than the pressure of the chamber 12c.

In the method MT, step ST22 is executed after the start (time t21 shown in FIG. 14) of step ST21, so that the temperature of the base 22 is adjusted to a high temperature (increased temperature). In the execution period (period from time t21 time t23 in FIG. 14) of step ST23, a relatively high-temperature heat exchange medium can be supplied to the flow channel 22f of the base 22. The supply of the relatively high-temperature heat exchange medium to the flow channel 22f may continue until the start of step ST26 to be described later.

In subsequent step ST23, the chuck main body 26 is temporarily attracted to the dielectric layer 24 in a state in which the temperature of the base 22 has been adjusted to an increased temperature. In the execution period (period from time t23 to time t24 shown in FIG. 14) of step ST23, no voltage is applied to the first electrode 261. In the execution period of step ST23, a voltage (fifth voltage) whose absolute value is relatively small is applied from the DC power supply DS2 to the second electrode 262, and a voltage (sixth voltage) whose absolute value is relatively small is applied from the DC power supply DS3 to the third electrode 263. In one embodiment, in the execution period of step ST23, the fifth voltage is intermittently applied from the DC power supply DS2 to the second electrode 262, and the sixth voltage is intermittently applied from the DC power supply DS3 to the third electrode 263. For example, the application of the fifth voltage from the DC power supply DS2 to the second electrode 262 for several seconds and the stop of the application of the voltage to the second electrode 262 for several seconds are alternately performed, and the application of the sixth voltage from the DC power supply DS3 to the third electrode 263 for several seconds and the stop of the application of the voltage to the third electrode 263 for several seconds are alternately performed. The absolute value of the fifth voltage is smaller than the absolute value of the third voltage, and the absolute value of the sixth voltage is smaller than the absolute value of the fourth voltage. In the execution period of step ST23, continuing from step ST21, a voltage is applied from the DC power supply DS4 to the fourth electrode 264, and a voltage is applied from the DC power supply DS5 to the fifth electrode 265. In the execution period of step ST23, the chamber 12c is depressurized by the exhaust device 50. In the execution period of step ST23, the flow channel 20g and the groove 260g are depressurized by the exhaust device 74. In the execution period of step ST23, the flow channel 20f is depressurized by the exhaust device 72. In addition, in the execution period of step ST23, continuing from step ST22, a high-temperature heat exchange medium is supplied to the flow channel 22f.

In the method MT, step STJb is executed during the execution of step ST23. In step STJb, a second determination is made as to whether or not the temperature difference (second temperature difference) between the temperature of the base 22 and the temperature of the chuck main body 26 is equal to or less than a second predetermined value. The temperature of the base 22 is measured by the temperature sensor 77, and the temperature of the chuck main body 26 is measured by the temperature sensor 76. The second predetermined value is a value within a range of, for example, 5° C. or more and 10° C. or less. In a case where it is determined that the second temperature difference is larger than the second predetermined value in step STJb, the execution of step ST23 is continued. On the other hand, in a case where it is determined that the second temperature difference is equal to or less than the second predetermined value in step STJb, step ST24 is executed.

In step ST24, the application of the voltage to the second electrode 262 and the application of the voltage to the third electrode 263 are stopped. The stop of the application of the voltage to the second electrode 262 and the stop of the application of the voltage to the third electrode 263 are continued after the start (time t24 shown in FIG. 14) of the execution period of step ST24. In the execution period (period from time t24 to time t25 shown in FIG. 14) of step ST24, no voltage is applied to the first electrode 261. In the execution period of step ST24, continuing from step ST23, a voltage is applied from the DC power supply DS4 to the fourth electrode 264, and a voltage is applied from the DC power supply DS5 to the fifth electrode 265. In the execution period of step ST24, the chamber 12c is depressurized by the exhaust device 50. In the execution period of step ST24, gas from the gas supply unit 73 is supplied to the flow channel 20g and the groove 260g. In the execution period of step ST24, the flow channel 20f is depressurized by the exhaust device 72. In addition, in the execution period of step ST24, continuing from step ST22, a high-temperature heat exchange medium is supplied to the flow channel 22f. In step ST24, the fixation of the chuck main body 26 to the base 22 is released.

In subsequent step ST25, the fixation of the focus ring FR to the chuck main body 26 is released, and the pressure of the chamber 12c is increased to, for example, atmospheric pressure. In the execution period (period from time t25 to time t26 shown in FIG. 14) of step ST25, no voltage is applied to the first electrode 261. In the execution period of step ST25, the application of the voltage to the second electrode 262 and the application of the voltage to the third electrode 263 are stopped. In the execution period of step ST25, the application of the voltage from the DC power supply DS4 to the fourth electrode 264 is stopped, and the application of the voltage from the DC power supply DS5 to the fifth electrode 265 is stopped. The stop of the application of the voltage from the DC power supply DS4 to the fourth electrode 264 and the stop of the application of the voltage from the DC power supply DS5 to the fifth electrode 265 are continued after the start of the execution period of step ST25. In the execution period of step ST25, the depressurization of the chamber 12c by the exhaust device 50 is stopped. In the execution period of step ST25, gas from the gas supply unit 73 may or may not be supplied to the flow channel 20g and the groove 260g. In the execution period of step ST25, gas from the gas supply unit 71 can be supplied to the flow channel 20f. In addition, in the execution period of step ST25, continuing from step ST24, a high-temperature heat exchange medium can be supplied to the flow channel 22f.

Subsequent step ST26 starts from time t26 shown in FIG. 14. In step ST26, the chamber 12c is opened. Accordingly, the pressure of the chamber 12c is set to atmospheric pressure. Subsequent step ST27 starts from time t27 shown in FIG. 14. In step ST27, the chuck main body 26 is detached, and the maintenance of the chuck main body 26 is performed.

In the method MT, step ST7 is executed in a state in which a large temperature difference occurs between the temperature of the base 22 and the temperature of the chuck main body 26. In step ST7, the chuck main body 26 is attracted to the dielectric layer 24 with a relatively small electrostatic attractive force. As a result, the temperature difference between the temperature of the base 22 and the temperature of the chuck main body 26 is reduced in a state in which the chuck main body 26 is not completely fixed to the base 22 via the dielectric layer 24. Then, in a case where the temperature difference between the temperature of the base 22 and the temperature of the chuck main body 26, that is, the first temperature difference becomes equal to or less than the first predetermined value, the chuck main body 26 is fixed to the base 22 via the dielectric layer 24 by the relatively large electrostatic attractive force in step ST8. Therefore, damage to the electrostatic chuck 20 and the malfunction of the electrostatic chuck 20 due to the temperature difference between the temperature of the base 22 and the temperature of the chuck main body 26 are suppressed.

In step ST7 of the embodiment, the first voltage and the second voltage are intermittently applied to the second electrode 262 and the third electrode 263, respectively. According to the embodiment, damage to the electrostatic chuck 20 is more reliably suppressed.

In the embodiment, in the case of detaching the chuck main body 26 from the base 22 and the dielectric layer 24 for maintenance of the chuck main body 26, the temperature of the base 22 is increased from the above-described lowered temperature. In the embodiment, in a case where the temperature of the base 22 is adjusted to the increased temperature, the chuck main body 26 is attracted to the dielectric layer 24 with a relatively small electrostatic attractive force in step ST23. As a result, the temperature difference between the temperature of the base 22 and the temperature of the chuck main body 26 is reduced in a state in which the chuck main body 26 is not completely fixed to the base 22 via the dielectric layer 24. Then, in a case where the temperature difference between the temperature of the base 22 and the temperature of the chuck main body 26, that is, the second temperature difference becomes equal to or less than the second predetermined value, the fixation of the chuck main body 26 to the base 22 is released in step ST24. Therefore, damage to the electrostatic chuck 20 due to the temperature difference between the temperature of the base 22 and the temperature of the chuck main body 26 is suppressed. During the maintenance of the chuck main body 26, the chuck main body 26 can be separated from the base 22 without separating the flow channel 22f of the base 22 for the heat exchange medium from a flow channel (flow channel provided by the pipe 23a and the pipe 23b) for supplying the heat exchange medium to the flow channel 22f. Therefore, leakage of the heat exchange medium during the maintenance of the chuck main body 26 is suppressed.

In step ST23 of the embodiment, the fifth voltage and the sixth voltage are intermittently applied to the second electrode 262 and the third electrode 263, respectively. According to the embodiment, damage to the electrostatic chuck 20 is more reliably suppressed.

In the embodiment, gas is supplied to the groove 260g through the flow channel 20g during the execution of at least one of steps ST21 and ST24. In the embodiment, even if the chuck main body 26 is attracted to the dielectric layer 24 due to residual charges or the like, the chuck main body 26 can be detached from the dielectric layer 24 by supplying gas to the groove 260g of the chuck main body 26.

Hereinbefore, various embodiments has been described. However, various modifications may be made without being limited to the above-described embodiments. Although the plasma processing apparatus in the embodiment described above is a capacitively coupled plasma processing apparatus, the plasma processing apparatus including the electrostatic chuck according to any of the above-described various embodiments may be any plasma processing apparatus, such as an inductively coupled plasma processing apparatus and a plasma processing apparatus that generates a plasma using surface waves such as microwaves. In the method MT, any plasma processing apparatus including the electrostatic chuck according to any of the above-described various embodiments can be used.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An electrostatic chuck, comprising:
   a base;
   a dielectric layer provided on the base; and
   a ceramic layer mounted on the dielectric layer and having a substrate support surface;
   a first electrostatic electrode provided in the ceramic layer; and
   a second electrostatic electrode and a third electrostatic electrode forming a bipolar electrode, provided in the ceramic layer, and provided between the first electrode and the dielectric layer.

2. The electrostatic chuck according to claim 1, wherein the second electrode and the third electrode are film-shaped electrodes and have comb-tooth shapes.

3. The electrostatic chuck according to claim 2, wherein the second electrode and the third electrode are provided so that comb teeth of the second electrode and comb teeth of the third electrode are alternately arranged along one direction.

4. The electrostatic chuck according to claim 1, wherein the dielectric layer is a resin layer bonded to the base with an adhesive layer.

5. The electrostatic chuck according to claim 4, wherein the resin layer is formed of polyimide.

6. A plasma processing apparatus, comprising:
a chamber main body that provides a chamber;
an electrostatic chuck defined in claim 1, provided in the chamber;
a radio frequency power supply that is electrically connected to the base;
a first DC power supply electrically connected to the first electrode of the electrostatic chuck;
a second DC power supply electrically connected to the second electrode of the electrostatic chuck; and
a third DC power supply electrically connected to the third electrode of the electrostatic chuck.

* * * * *